(12) United States Patent
Hoffman et al.

(10) Patent No.: US 6,528,751 B1
(45) Date of Patent: Mar. 4, 2003

(54) PLASMA REACTOR WITH OVERHEAD RF ELECTRODE TUNED TO THE PLASMA

(75) Inventors: Daniel J. Hoffman, Saratoga, CA (US); Gerald Zheyao Yin, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/527,342

(22) Filed: Mar. 17, 2000

(51) Int. Cl.$^7$ .............................................. B23K 10/00
(52) U.S. Cl. ......................... 219/121.43; 219/121.41; 219/121.52; 118/723 I; 156/345
(58) Field of Search ..................... 219/121.41, 121.4, 219/121.43, 121.57, 121.59; 315/111.51; 118/723 I, 723 VE; 156/345, 646.1

(56) References Cited

U.S. PATENT DOCUMENTS

| | | | |
|---|---|---|---|
| 4,464,223 A | 8/1984 | Gorin | 156/643 |
| 4,579,618 A | 4/1986 | Celestino et al. | 156/345 |
| 4,859,908 A | 8/1989 | Yoshida et al. | 315/111.81 |
| 4,973,883 A | 11/1990 | Hirose et al. | 315/111.41 |
| 4,990,229 A | 2/1991 | Campbell et al. | 204/298.06 |
| 5,017,835 A | 5/1991 | Oechsner | 315/111.81 |
| 5,032,202 A | 7/1991 | Tsai et al. | 156/345 |
| 5,077,499 A | 12/1991 | Oku | |
| 5,115,167 A | 5/1992 | Ootera et al. | 315/111.21 |
| 5,122,251 A | 6/1992 | Campbell et al. | 204/298.06 |
| 5,195,045 A * | 3/1993 | Keane et al. | 364/482 |
| 5,198,725 A | 3/1993 | Chen et al. | 315/111.41 |
| 5,210,466 A | 5/1993 | Collins et al. | 315/111.21 |
| 5,223,457 A | 6/1993 | Mintz et al. | 437/225 |
| 5,272,417 A | 12/1993 | Ohmi | 315/111.21 |
| 5,274,306 A | 12/1993 | Kaufman et al. | 315/111.41 |
| 5,279,669 A | 1/1994 | Lee | 118/723 |
| 5,280,219 A | 1/1994 | Ghanbari | 315/111.41 |
| 5,300,460 A | 4/1994 | Collins et al. | 437/225 |
| 5,453,305 A | 9/1995 | Lee | 427/562 |
| 5,512,130 A | 4/1996 | Barna et al. | 156/651.1 |
| 5,534,070 A * | 7/1996 | Okamura et al. | 118/723 E |
| 5,537,004 A | 7/1996 | Imahashi et al. | 315/111.21 |
| 5,567,268 A | 10/1996 | Kadomura | 156/345 |
| 5,587,038 A | 12/1996 | Cecchi et al. | 156/345 |
| 5,592,055 A | 1/1997 | Capacci et al. | 315/111.21 |
| 5,605,637 A | 2/1997 | Shan et al. | 216/71 |
| 5,618,382 A | 4/1997 | Mintz et al. | 216/64 |
| 5,627,435 A | 5/1997 | Jansen et al. | 315/111.21 |
| 5,674,321 A | 10/1997 | Pu et al. | 118/723 |
| 5,705,019 A | 1/1998 | Yamada et al. | |
| 5,707,486 A | 1/1998 | Collins | 156/643.1 |
| 5,710,486 A | 1/1998 | Ye et al. | 315/111.21 |
| 5,720,826 A | 2/1998 | Hayashi et al. | 136/249 |
| 5,733,511 A * | 3/1998 | De Francesco | 422/186.05 |
| 5,846,885 A | 12/1998 | Kamata et al. | 438/729 |
| 5,849,136 A | 12/1998 | Mintz et al. | 156/345 |
| 5,849,372 A | 12/1998 | Annaratone et al. | 427/569 |
| 5,855,685 A | 1/1999 | Tobe et al. | 118/723 |
| 5,858,819 A | 1/1999 | Miyasaka | 438/149 |
| 5,863,376 A | 1/1999 | Wicker et al. | 156/345 |
| 5,914,568 A | 6/1999 | Nonaka | 315/111.21 |
| 5,936,481 A * | 8/1999 | Fujii | 333/17.3 |
| 6,043,608 A * | 3/2000 | Samukawa et al. | 315/111.51 |
| 6,093,457 A * | 7/2000 | Okamura et al. | 427/569 |
| 6,096,160 A | 8/2000 | Kadomura | 156/345 |
| 6,110,395 A | 8/2000 | Gibson, Jr. | 216/67 |
| 6,152,071 A * | 11/2000 | Akiyama et al. | 118/723 E |
| 6,155,200 A | 12/2000 | Horiike et al. | 118/723 |
| 6,162,709 A | 12/2000 | Raoux et al. | |

FOREIGN PATENT DOCUMENTS

EP        0 678 903 A1     10/1995

* cited by examiner

*Primary Examiner*—Mark Paschall
(74) *Attorney, Agent, or Firm*—Law Offices of Robert Wallace; Joseph Bach

(57) ABSTRACT

In accordance with one aspect of the invention, a plasma reactor has a capacitive electrode driven by an RF power source, and the electrode capacitance is matched at the desired plasma density and RF source frequency to the negative capacitance of the plasma, to provide an electrode plasma resonance supportive of a broad process window within which the plasma may be sustained.

94 Claims, 10 Drawing Sheets

PLASMA REACTOR WITH OVERHEAD RF ELECTRODE TUNED TO THE PLASMA

BACKGROUND OF THE INVENTION

An RF plasma reactor is used to process semiconductor wafers to produce microelectronic circuits. The reactor forms a plasma within a chamber containing the wafer to be processed. The plasma is formed and maintained by application of RF plasma source power coupled either inductively or capacitively into the chamber. For capacitive coupling of RF source power into the chamber, an overhead electrode (facing the wafer) is powered by an RF source power generator.

One problem in such reactors is that the output impedance of the RF generator, typically 50 Ohms, must be matched to the load impedance presented by the combination of the electrode and the plasma. Otherwise the amount of RF power delivered to the plasma chamber will fluctuate with fluctuations in the plasma load impedance so that certain process parameters such as plasma density cannot be held within the required limits. The plasma load impedance fluctuates during processing because it depends upon conditions inside the reactor chamber which tend to change dynamically as processing progresses. At an optimum plasma density for dielectric or metal etch processes, the load impedance is very small compared to the output impedance of the RF generator and can vary significantly during the processing of the wafer. Accordingly, an impedance match circuit must be employed to actively maintain an impedance match between the generator and the load. Such active impedance matching uses either a variable reactance and/or a variable frequency. One problem with such impedance match circuits is that they must be sufficiently agile to follow rapid changes in the plasma load impedance, and therefore are relatively expensive and can reduce system reliability due to their complexity.

Another problem is that the range of load impedances over which the match circuit can provide an impedance match (the "match space") is limited. The match space is related to the system Q, where Q=$\Delta$f/f, f being a resonant frequency of the system and $\Delta$f being the bandwidth on either side of f within which resonant amplitude is within 6 dB of the peak resonant amplitude at f. The typical RF generator has a limited ability to maintain the forward power at a nearly constant level even as more RF power is reflected back to the generator as the plasma impedance fluctuates. Typically, this is achieved by the generator servoing its forward power level, so that as an impedance mismatch increases (and therefore reflected power increases), the generator increases its forward power level. Of course, this ability is limited by the maximum forward power of which the generator is capable of producing. Typically, the generator is capable of handling a maximum ratio of forward standing wave voltage to reflected wave voltage (i.e., the voltage standing wave ratio or VSWR) of not more than 3:1. If the difference in impedances increases (e.g., due to plasma impedance fluctuations during processing) so that the VSWR exceeds 3:1, then the RF generator can no longer control the delivered power, and control over the plasma is lost. As a result, the process is likely to fail. Therefore, at least an approximate impedance match must be maintained between the RF generator and the load presented to it by the combination of the coil antenna and the chamber. This approximate impedance match must be sufficient to keep the VSWR at the generator output within the 3:1 VSWR limit over the entire anticipated range of plasma impedance fluctuations. The impedance match space is, typically, the range of load impedances for which the match circuit can maintain the VSWR at the generator output at or below 3:1.

A related problem is that the load impedance itself is highly sensitive to process parameters such as chamber pressure, source power level, source power frequency and plasma density. This limits the range of such process parameters (the "process window") within which the plasma reactor must be operated to avoid an unacceptable impedance mismatch or avoid fluctuations that take load impedance outside of the match space. Likewise, it is difficult to provide a reactor which can be operated outside of a relatively narrow process window and use, or one that can handle many applications.

Another related problem is that the load impedance is also affected by the configuration of the reactor itself, such as dimensions of certain mechanical features and the conductivity or dielectric constant of certain materials within the reactor. (Such configurational items affect reactor electrical characteristics, such as stray capacitance for example, that in turn affect the load impedance.) This makes it difficult to maintain uniformity among different reactors of the same design due to manufacturing tolerances and variations in materials. As a result, with a high system Q and correspondingly small impedance match space, it is difficult to produce any two reactors of the same design which exhibit the same process window or provide the same performance.

Another problem is inefficient use of the RF power source. Plasma reactors are known to be inefficient, in that the amount of power delivered to the plasma tends to be significantly less than the power produced by the RF generator. As a result, an additional cost in generator capability and a trade-off against reliability must be incurred to produce power in excess of what is actually required to be delivered into the plasma.

SUMMARY OF THE INVENTION

In accordance with one aspect of the invention, a plasma reactor has a capacitive electrode driven by an RF power source, and the electrode capacitance is matched at the desired plasma density and RF source frequency to the negative capacitance of the plasma, to provide an electrode plasma resonance and a broad process window within which the plasma may be sustained. It is a discovery of the invention that selecting a VHF frequency for the RF power source enables the foregoing match to be implemented at plasma densities which favor certain plasma processes such as etch processes.

In accordance with another aspect of the invention, an RF source is impedance-matched to the electrode-plasma load impedance through a tuning stub connected at one end to the electrode. The stub has a length providing a resonance at or near the frequency of the RF source and/or the resonant frequency of the electrode-plasma combination. The RF generator is tapped to the stub at or near a location along the stub at which the input impedance matches the RF source impedance.

In a preferred embodiment, the process window is further expanded by slightly offsetting the electrode-plasma resonant frequency, the stub resonant frequency and the RF source frequency from one another.

DESCRIPTION OF THE PREFERRED EMBODIMENTS

Figure 1:
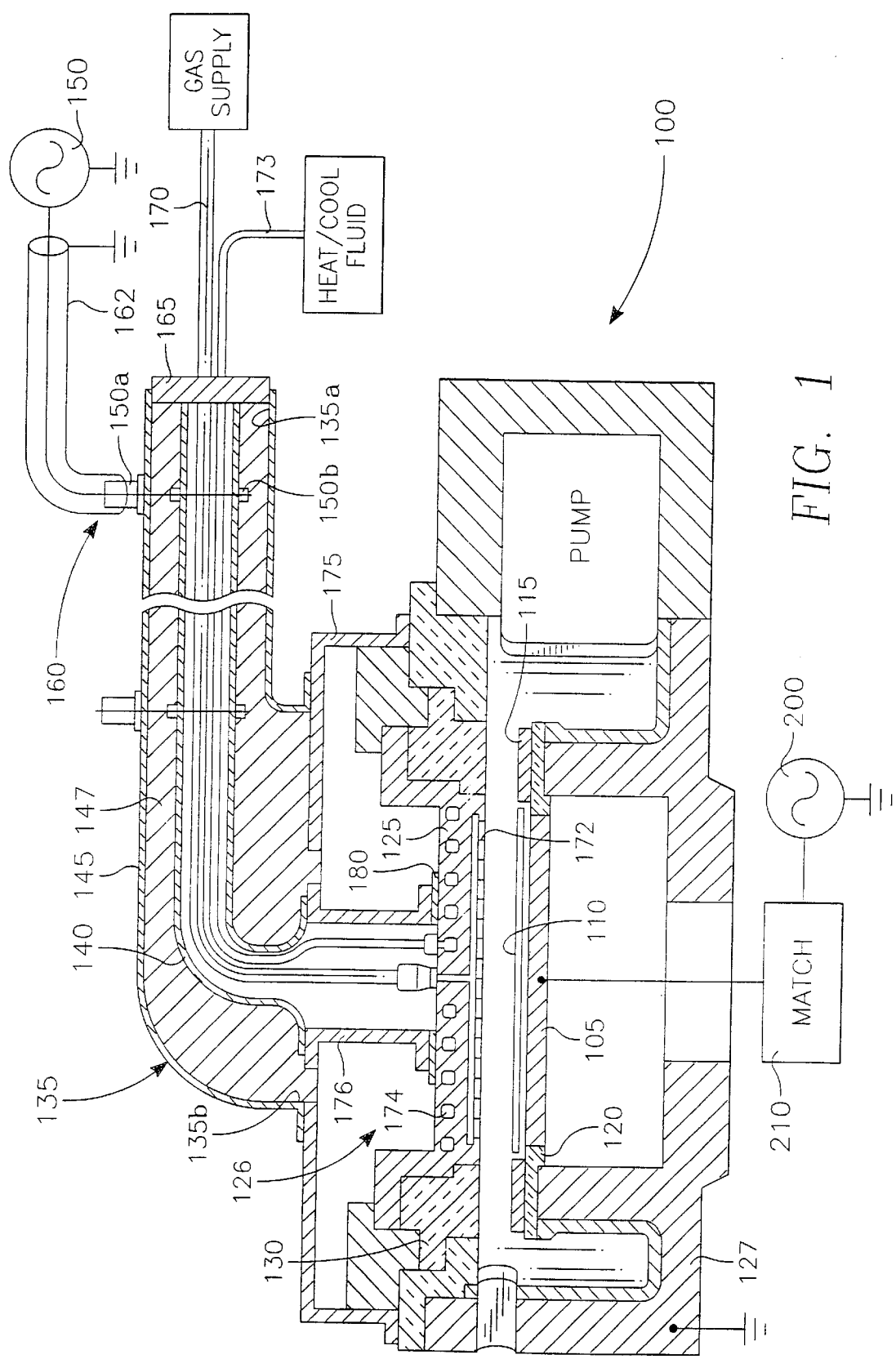
FIG. 1 is a cut-away cross-sectional side view of a plasma reactor embodying the present invention.

Preferred Embodiment Overview:

Referring to FIG. 1, a plasma reactor includes a reactor chamber 100 with a wafer support 105 at the bottom of the chamber supporting a semiconductor wafer 110. A semiconductor ring 115 surrounds the wafer 110. The semiconductor ring 115 is supported on the grounded chamber body 127 by a dielectric (quartz) ring 120. In the preferred embodiment, this is of a thickness of 10 mm and dielectric constant of 4. The chamber 100 is bounded at the top by a disc shaped overhead aluminum electrode supported at a predetermined gap length above the wafer 110 on grounded chamber body 127 by a dielectric (quartz) seal. The overhead electrode 125 also may be a metal (e.g., aluminum) which may be covered with a semi-metal material (e.g., Si or SiC) on its interior surface, or it may be itself a semi-metal material. An RF generator 150 applies RF power to the electrode 125. RF power from the generator 150 is coupled through a coaxial cable 162 matched to the generator 150 and into a coaxial stub 135 connected to the electrode 125. The stub 135 has a characteristic impedance, resonance frequency, and provides an impedance match between the electrode 125 and the coaxial cable 162/RF power generator 150, as will be more fully described below. The chamber body is connected to the RF return (RF ground) of the RF generator 150. The RF path from the overhead electrode 125 to RF ground is affected by the capacitance of the semiconductor ring 115, the dielectric ring 120 and the dielectric seal 130. The wafer support 105, the wafer 110 and the semiconductor ring 115 provide the primary RF return path for RF power applied to the electrode 125.

The capacitance of the overhead electrode assembly 126, including the electrode 125, the dielectric ring 120 and dielectric seal 130 measured with respect to RF return or ground is, in the preferred embodiment, preferably 180 pico farads. The electrode assembly capacitance is affected by the electrode area, the gap length (distance between wafer support and overhead electrode), and by factors affecting stray capacitances, especially the dielectric values of the seal 130 and of the dielectric ring 120, which in turn are affected by the dielectric constants and thicknesses of the materials employed. More generally in the preferred embodiment, the capacitance. of the electrode assembly (an unsigned number or scalar) is equal or nearly equal in magnitude to the negative capacitance of the plasma (a complex number) at a particular source power frequency, plasma density and operating pressure, as will be discussed below.

Many of the factors influencing the foregoing relationship are in great part predetermined due to the realities of the plasma process requirements needed to be performed by the reactor, the size of the wafer, and the requirement that the processing be carried out uniformly over the wafer. Thus, the plasma capacitance is a function of the plasma density and the source power frequency, while the electrode capacitance is a function of the wafer support-to-electrode gap (height), electrode diameter, and dielectric values of the insulators of the assembly. Plasma density, operating pressure, gap, and electrode diameter must satisfy the requirements of the plasma process to be performed by the reactor. In particular, the ion density must be within a certain range. For example, silicon and dielectric plasma etch processes generally require the plasma ion density to be within the range of $10^9$–$10^{12}$ ions/cc. The wafer electrode gap provides an optimum plasma ion distribution uniformity for 8 inch wafers, for example, if the gap is about 2 inches. The electrode diameter is preferably at least as great as, if not greater than the diameter of the wafer. Operating pressures similarly have practically preferred ranges for typical etch and other plasma processes.

But it has been found that other factors remain which can be selected to achieve the above preferred relationship, particularly choice of source frequency and choice of capacitances for the overhead electrode assembly 126. Within the foregoing dimensional constraints imposed on the electrode and the constraints (e.g., density range) imposed on the plasma, the electrode capacitance can be matched to the magnitude of the negative capacitance of the plasma if the source power frequency is selected to be a VHF frequency, and if the dielectric values of the insulator components of electrode assembly 126 are selected properly. Such selection can achieve a match or near match between source power frequency and plasma-electrode resonance frequency.

Accordingly in one aspect of the preferred embodiment, for an 8-inch wafer the overhead electrode diameter is approximately 11 inches, the gap is about 2 inches, the plasma density and operating pressure is typical for etch processes as above-stated, the dielectric material for the seal 130 has a dielectric constant of 9 and a thickness of the order of 1 inch, the ring 115 has an inner diameter of slightly in excess of 10 inches and an outer diameter of about 13 inches, the ring 120 has a dielectric constant of 4 and a thickness of the order of 10 mm, the VHF source power frequency is 210 MHz (although other VHF frequencies could be equally effective), and the source power frequency, the plasma electrode resonance frequency and the stub resonance frequency are all matched or nearly matched.

More particularly, in the preferred embodiment these three frequencies are slightly offset from one another, with the source power frequency being 210 MHz, the electrode-plasma resonant frequency being approximately 200 MHz, and the stub frequency being about 220 MHz, in order to achieve a de-tuning effect which advantageously reduces the system Q. Such a reduction in system Q renders the reactor performance less susceptible to changes in conditions inside the chamber, so that the entire process is much more stable and can be carried out over a far wider process window.

The coaxial stub 135 is a specially configured design which further contributes to the overall system stability, its wide process window capabilities, as well as many other valuable advantages. It includes an inner cylindrical conductor 140 and an outer concentric cylindrical conductor 145. An insulator 147 (denoted by cross-hatching in FIG. 1) preferably having a relative dielectric constant of 1 fills the space between the inner and outer conductors 140, 145. The inner and outer conductors 140, 145 are formed of nickel-coated aluminum. In the preferred embodiment, the outer conductor 145 preferably has a diameter of about 4.32 inches and the inner conductor 140 preferably has a diameter of about 1.5 inches. The stub characteristic impedance is determined by the radii of the inner and outer conductors 140, 145 and the dielectric constant of the insulator 147. The stub 135 of the preferred embodiment described above has a characteristic impedance of 65 Ω. More generally, the stub characteristic impedance exceeds the source power output impedance by about 20%–40% and preferably by about 30%. The stub 135 has an axial length of about 29 inches—a quarter wavelength at 220 MHz—in order to have a resonance in the vicinity of 220 MHz to generally match while being slightly offset from the preferred VHF source power frequency of 210 MHz.

A tap 160 is provided at a particular point along the axial length of the stub 135 for applying RF power from the RF generator 150 to the stub 135, as will be discussed below. The RF power terminal 150$a$ and the RF return terminal 150$b$ of the generator 150 are connected at the tap 160 on the stub 135 to the inner and outer coaxial stub conductors 140, 145, respectively. These connections are made via a generator-to-stub coaxial cable 162 having a characteristic impedance that matches the output impedance of the generator 150 (typically, 50 Ω) in the well-known manner. A terminating conductor 165 at the far end 135$a$ of the stub 135 shorts the inner and outer conductors 140, 145 together, so that the stub 135 is shorted at its far end 135$a$. At the near end 135$b$ (the unshorted end) of the stub 135, the outer conductor 145 is connected to the chamber body via an annular conductive housing or support 175, while the inner conductor 140 is connected to the center of electrode 125 via a conductive cylinder or support 176. Preferably, a dielectric ring 180, which in the preferred embodiment has a thickness of 1.3 inch and dielectric constant 9, is held between and separates the conductive cylinder 176 and the electrode 125.

Preferably, the inner conductor 140 provides a conduit for utilities such as process gases and coolant. The principal advantage of this feature is that, unlike typical plasma reactors, the gas line 170 and the coolant line 173 do not cross large electrical potential differences. They therefore may be constructed of metal, a less expensive and more reliable material for such a purpose. The metallic gas line 170 feeds gas inlets 172 in or adjacent the overhead electrode 125 while the metallic coolant line 173 feeds coolant passages or jackets 174 within the overhead electrode 125.

An active and resonant impedance transformation is thereby provided by this specially configured stub match between the RF generator 150, and the overhead electrode assembly 126 and processing plasma load, minimizing reflected power and providing a very wide impedance match space accomodating wide changes in load impedance. Consequently, wide process windows and process flexibility is provided, along with previously unobtainable efficiency in use of power, all while minimizing or avoiding the need for typical impedance match apparatus. As noted above, the stub resonance frequency is also offset from ideal match to further enhance overall system Q, system stability and process windows and multi-process capability.

Matching the Electrode-Plasma Resonance Frequency and the VHF Source Power Frequency As outlined above, a principal feature is to configure the overhead electrode assembly 126 for resonance with the plasma at the electrode-plasma resonant frequency and for the matching (or the near match of) the source power frequency and the electrode-plasma frequency. The electrode assembly 126 has a predominantly capacitive reactance while the plasma reactance is a complex function of frequency, plasma density and other parameters. (As will be described below in greater detail, a plasma is analyzed in terms of a reactance which is a complex function involving imaginary terms and generally corresponds to a negative capacitance.) The electrode-plasma resonant frequency is determined by the reactances of the electrode assembly 126 and of the plasma (in analogy with the resonant frequency of a capacitor/inductor resonant circuit being determined by the reactances of the capacitor and the inductor). Thus the electrode-plasma resonant frequency may not necessarily be the source power frequency, depending as it does upon the plasma density. The problem, therefore, in carrying out the preferred embodiment of the invention, is to find a source power frequency at which the plasma reactance is such that the electrode-plasma resonant frequency is equal or nearly equal to the source power frequency, given the constraints of practical confinement to a particular range of plasma density and electrode dimensions. The problem is even more difficult, because the plasma density (which affects the plasma reactance) and the electrode dimensions (which affect electrode capacitance) must meet certain process constraints. Specifically, for dielectric and metal plasma etch processes, the plasma density should be within the range of $10^9$–$10^{12}$ ions/cc, which is a constraint on the plasma reactance. Moreover, a more uniform plasma ion density distribution for processing 8-inch diameter wafers for example, is realized by a wafer-to-electrode gap or height of about 2 inches and an electrode diameter on the order of the wafer diameter, or greater, which is a constraint on the electrode capacitance.

Accordingly in one feature of the preferred embodiment, by matching (or nearly matching) the electrode capacitance to the magnitude of the negative capacitance of the plasma, the electrode-plasma resonant frequency and the source power frequency are at least nearly matched. For the general metal and dielectric etch process conditions enumerated above (i.e., plasma density between $10^9$–$10^{12}$ ions/cc, a 2-inch gap and an electrode diameter on the order of roughly 11 inches), the match is possible if the source power frequency is a VHF frequency. Other conditions (e.g., different wafer diameters, different plasma densities, etc.) may dictate a different frequency range to realize such a match in carrying out this feature of the invention. As will be detailed below, under favored plasma processing conditions for processing 8-inch wafers in several principal applications including dielectric and metal plasma etching and chemical vapor deposition, the plasma capacitance in one typical working example of the preferred embodiment having plasma densities as set forth above was between −50 and −400 pico farads. In the preferred embodiment the capacitance of the overhead electrode assembly 126 was matched to the magnitude of this negative plasma capacitance by using an electrode diameter of 11 inches, a gap length (electrode to pedestal spacing) of approximately 2 inches, choosing a dielectric material for seal 130 having a dielectric constant of 9, and a thickness of the order of one inch, and a dielectric material for the ring 120 having a dielectric constant of 4 and thickness of the order of 10 mm.

The combination of electrode assembly 126 and the plasma resonates at an electrode-plasma resonant frequency that at least nearly matches the source power frequency applied to the electrode 125, assuming a matching of their capacitances as just described. We have discovered that for favored etch plasma processing recipes, environments and plasmas, this electrode-plasma resonant frequency and the source power frequency can be matched or nearly matched at VHF frequencies; and that it is highly advantageous that such a frequency match or near-match be implemented. In the preferred embodiment, the electrode-plasma resonance frequency corresponding to the foregoing values of plasma negative capacitance is approximately 200 MHz, as will be detailed below. The source power frequency is 210 MHz, a near-match in which the source power frequency is offset slightly above the electrode-plasma resonance frequency in order to realize other advantages to be discussed below.

The plasma capacitance is a function of among other things, plasma electron density. This is related to plasma ion density, which needs, in order to provide good plasma processing conditions, to be kept in a range generally $10^9$ to $10^{12}$ ions/cc. This density, together with the source power frequency and other parameters, determines the plasma negative capacitance, the selection of which is therefore constrained by the need to optimize plasma processing conditions, as will be further detailed below. But the overhead electrode assembly capacitance is affected by many physical factors, e.g. gap length (spacing between electrode 125 and the wafer); the area of electrode 125; the choice of dielectric constant of the dielectric seal 130 between electrode 125 and grounded chamber body 127; the choice of dielectric constant for the dielectric ring 120 between semiconductor ring 115 and the chamber body; and the thickness of the dielectric structures of seal 130 and ring 120 and the thickness and dielectric constant of the ring 180. This permits some adjustment of the electrode assembly capacitance through choices made among these and other physical factors affecting the overhead electrode capacitance. We have found that the range of this adjustment is sufficient to achieve the necessary degree of matching of the overhead electrode assembly capacitance to the magnitude of the negative plasma capacitance. In particular, the dielectric materials and dimensions for the seal 130 and ring 120 are chosen to provide the desired dielectric constants and resulting dielectric values. Matching the electrode capacitance and the plasma capacitance can then be achieved despite the fact that some of the same physical factors influencing electrode capacitance, particularly gap length, will be dictated or limited by the following practicalities: the need to handle larger diameter wafers; to do so with good uniformity of distribution of plasma ion density over the full diameter of the wafer; and to have good control of ion density vs ion energy.

Accordingly in the preferred embodiment, for plasma ion density ranges as set forth above favorable to plasma etch processes; and for chamber dimensions suitable for processing 8 inch wafers, a capacitance for electrode assembly 126 was achieved which matched the plasma capacitance of −50 to −400 pico farads by using an electrode diameter of 11 inches, a gap length of approximately 2 inches, and a material for the seal 130 having a dielectric constant of 9, and a material for the ring 120 having a dielectric constant of 4.

Given the foregoing range for the plasma capacitance and the matching overhead electrode capacitance, the electrode-plasma resonance frequency was approximately 200 MHz for a source power frequency of 210 MHz.

A great advantage of choosing the capacitance of the electrode assembly 126 in this manner, and then matching the resultant electrode-plasma resonant frequency and the source power frequency, is that resonance of the electrode and plasma near the source power frequency provides a wider impedance match and wider process window, and consequently much greater immunity to changes in process conditions, and therefore greater performance stability. The entire processing system is rendered less sensitive to variations in operating conditions, e.g., shifts in plasma impedance, and therefore more reliable along with a greater range of process applicability. As will be discussed later in the specification, this advantage is further enhanced by the small offset between the electrode-plasma resonant frequency and the source power frequency.

Why the Plasma Has a Negative Capacitance:

The capacitance of the plasma is governed by the electrical permittivity of the plasma, $\in$, which is a complex number and is a function of the electrical permittivity of free space $\in_0$, the plasma electron frequency $\omega_{pe}$, the source power frequency $\omega$ and the electron-neutral collision frequency $\nu_{en}$ in accordance with the following equation:

$$\in = \in_0[1 - \omega_{pe}^2/(\omega(\omega + i\nu_{en}))] \text{ where } i = (-1)^{1/2}.$$

(The plasma electron frequency $\omega_{pe}$ is a simple function of the plasma electron density and is defined in well-known publications on plasma processing.)

In one working example, the neutral species was Argon, the plasma electron frequency was about 230 MHz, the RF source power frequency was about 210 MHz with chamber pressure in the range of 10 mT to 200 mT with sufficient RF power applied so that the plasma density was between $10^9$ and $10^{12}$ cc$^{-1}$. Under these conditions, which are typical of those favorable to plasma etch processes, the plasma generally has a negative capacitance because its effective electrical permittivity defined by the foregoing equation is negative. Under these conditions, the plasma had a negative capacitance of −50 to −400 pico farads. Then as we have seen above in more general terms, the plasma capacitance, as a function of plasma electron density (as well as source power frequency and electron-neutral collision frequency) tends to be generally limited by favored plasma process realities for key applications such as dielectric etch, metal etch and CVD, to certain desired ranges, and to have a negative value at VHF source power frequencies. By exploiting these characteristics of the plasma, the electrode capacitance matching and frequency-matching features of the invention achieve a process window capability and flexibility and stability of operation not previously possible.

Impedance Transformation Provided by the Stub 135:

The stub 135 provides an impedance transformation between the 50 Ω output impedance of the RF generator 150 and the load impedance presented by the combination of the electrode assembly 126 and the plasma within the chamber. For such an impedance match, there must be little or no reflection of RF power at the generator-stub connection and at the stub-electrode connection (at least no reflection exceeding the VSWR limits of the RF generator 150). How this is accomplished will now be described.

At the desired VHF frequency of the generator 150 and at a plasma density and chamber pressure favorable for plasma etch processes (i.e., $10^9$–$10^{12}$ ions/cm$^3$ and 10 mT–200 mT, respectively), the impedance of the plasma itself is about (0.3+(i)7)Ω, where 0.3 is the real part of the plasma impedance, i=$(-1)^{1/2}$, and 7 is the imaginary part of the plasma impedance. The load impedance presented by the electrode-plasma combination is a function of this plasma impedance and of the capacitance of the electrode assembly 126. As described above, the capacitance of the electrode assembly 126 is selected to achieve a resonance between the electrode assembly 126 and the plasma with an electrode-plasma resonant frequency of about 200 MHz. Reflections of RF power at the stub-electrode interface are minimized or avoided because the resonant frequency of the stub 135 is set to be at or near the electrode-plasma resonant frequency so that the two at least nearly resonate together.

At the same time, reflections of RF power at the generator-stub interface are minimized or avoided because the location of the tap 160 along the axial length of the stub 135 is such that, at the tap 160, the ratio of the standing wave voltage to the standing wave current in the stub 135 is near the output impedance of the generator 150 or characteristic impedance of the cable 162 (both being about 50 Ω). How the tap 160 is located to achieve this will now be discussed.

Axial Location of the Stub's Tap 160:

The axial length of the coaxial stub 135 preferably is a multiple of a quarter wavelength of a "stub" frequency (e.g., 220 MHz) which, as stated above, is near the electrode-plasma resonant frequency. In the preferred embodiment, this multiple is two, so that the coaxial stub length is about a half wavelength of the "stub" frequency, or about 29 inches.

Figure 2A:
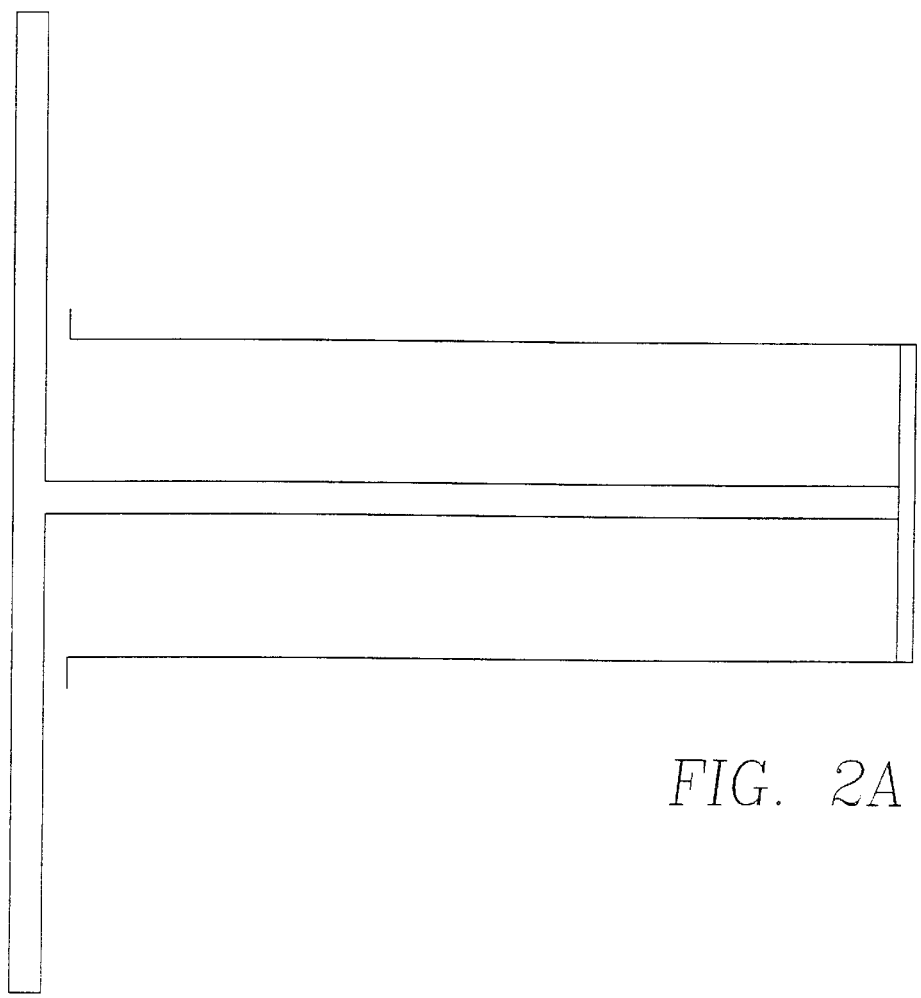
FIGS. 2A and 2B are diagrams illustrating, respectively, the coaxial stub of FIG. 1 and the voltage and current standing wave amplitudes as a function of position along the coaxial stub.
Figure 2B:
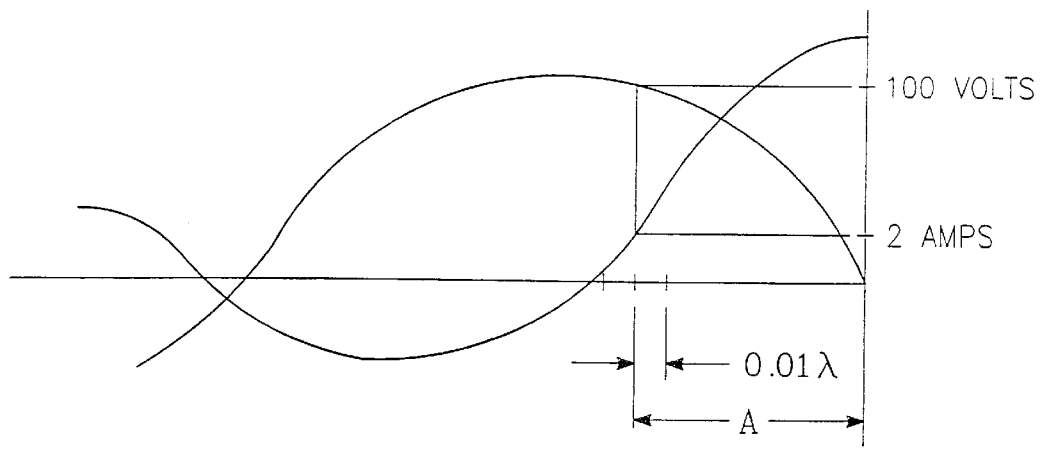

The tap 160 is at a particular axial location along the length of the stub 135. At this location, the ratio between the amplitudes of the standing wave voltage and the standing wave current of an RF signal at the output frequency of the generator 150 corresponds to an input impedance matching the output impedance of the RF generator 150 (e.g., 50 Ohms). This is illustrated in FIGS. 2A and 2B, in which the voltage and current standing waves in the stub 135 have a null and a peak, respectively, at the shorted outer stub end 135a. A desired location for the tap 160 is at a distance A inwardly from the shorted end, where the ratio of the standing wave voltage and current corresponds to 50 Ohms. This location is readily found by the skilled worker by empirically determining where the standing wave ratio is 50 Ohms. The distance or location A of the tap 160 that provides a match to the RF generator output impedance (50 Ω) is a function of the characteristic impedance of the stub 135, as will be described later in this specification. When the tap 160 is located precisely at the distance A, the impedance match space accomodates a 9:1 change in the real part of the load impedance, if the RF generator is of the typical kind that can maintain constant delivered power over a 3:1 voltage standing wave ratio (VSWR).

In the preferred embodiment, the impedance match space is greatly expanded to accommodate a nearly 60:1 change in the real part of the load impedance. This dramatic result is achieved by slightly shifting the tap 160 from the precise 50 Ω point at location A toward the shorted external end 135a of the coaxial stub 135. This shift is preferably 5% of a wavelength in the preferred embodiment (i.e., about 1.5 inch). It is a discovery of the invention that at this slightly shifted tap location, the RF current contribution at the tap 160 subtracts or adds to the current in the stub, which ever becomes appropriate, to compensate for fluctuations in the plasma load impedance, as will be described below with reference to FIGS. 3 and 4. This compensation is sufficient to increase the match space from one that accomodates a 9:1 swing in the real part of the load impedance to a 60:1 swing.

It is felt that this behavior is due to a tendency of the phase of the standing wave current in the stub 135 to become more sensitive to an impedance mismatch with the electrode-plasma load impedance, as the tap point is moved away from the "match" location at A. As described above, the electrode assembly 126 is matched to the negative capacitance of the plasma under nominal operating conditions. This capacitance is −50 to −400 pico farads at the preferred VHF source power frequency (210 MHz). At this capacitance the plasma exhibits a plasma impedance of (0.3+i7)Ω. Thus, 0.3 Ω is the real part of the plasma impedance for which the system is tuned. As plasma conditions fluctuate, the plasma capacitance and impedance fluctuate away from their nominal values. As the plasma capacitance fluctuates from that to which the electrode 125 was matched, the phase of the electrode-plasma resonance changes, which affects the phase of the current in the stub 135. As the phase of the stub's standing wave current thus shifts, the RF generator current supplied to the tap 160 will either add to or subtract from the stub standing wave current, depending upon the direction of the phase shift. The displacement of the tap 160 from the 50 Ω location at A is limited to a small fraction of the wavelength (e.g., 5%).

Figure 3:
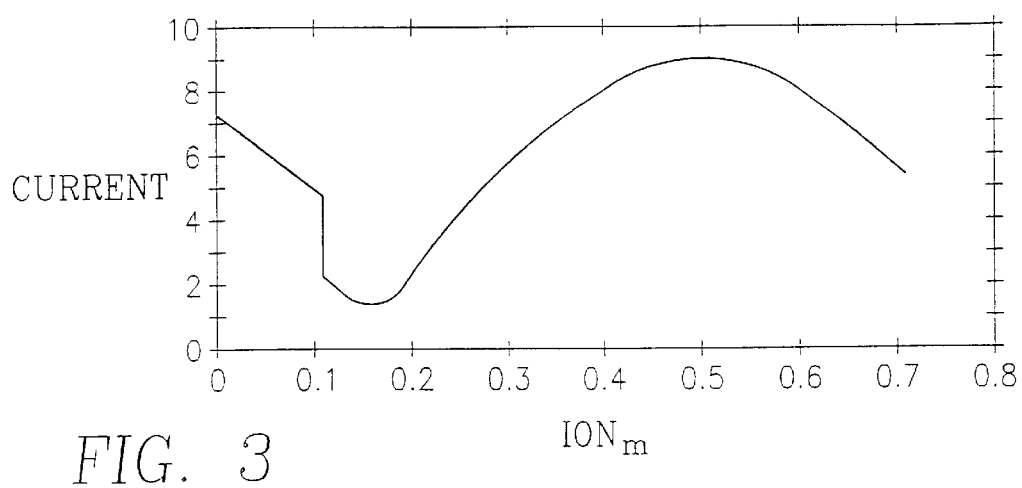
FIG. 3 illustrates the subtraction of current at the input power tap point on the coaxial stub that occurs in response to high plasma load impedance in a preferred embodiment to maintain a more constant delivered VHF power level in a larger match space.

FIG. 3 illustrates the standing wave current in the stub 135 when the real part of the plasma impedance has increased due to plasma fluctuations. In FIG. 3, the current standing wave amplitude is plotted as a function of axial location along the stub 135. A discontinuity in the standing wave current amplitude at the location 0.1 on the horizontal axis corresponds to the position of the tap 160. In the graph of FIG. 3, an impedance mismatch occurs because the real part of the plasma impedance is high, above the nominal plasma impedance for which the system is tuned (i.e., at which the electrode capacitance matches the negative plasma capacitance). In this case, the current at the tap 160 subtracts from the standing wave current in the stub 135. This subtraction causes the discontinuity or null in the graph of FIG. 3, and reduces the delivered power to offset the increased load. This avoids a corresponding increase in delivered power ($I^2R$), due to the higher load (R).

Figure 4:
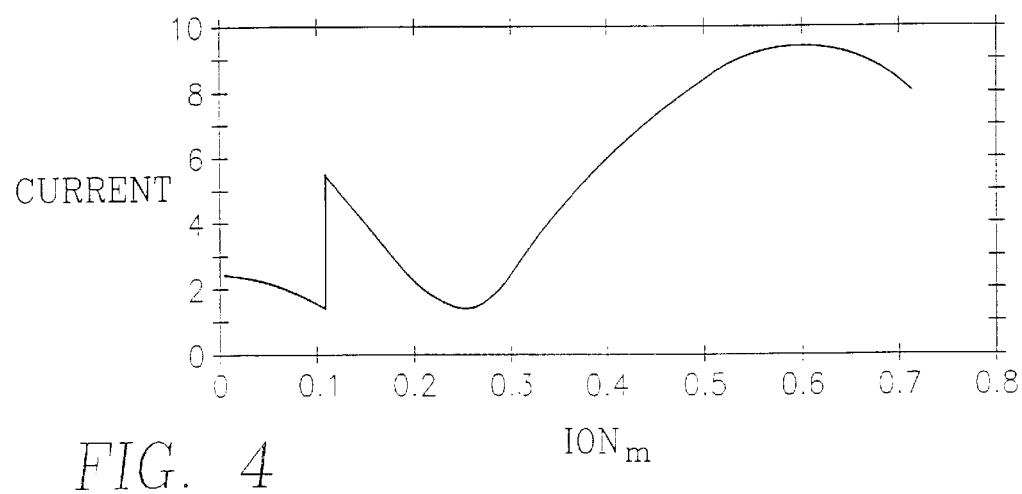
FIG. 4 illustrates the addition of current at the input power tap point on the coaxial stub that occurs in response to low plasma load impedance in a preferred embodiment to maintain a more constant delivered VHF power level in a larger match space.

FIG. 4 illustrates the standing wave current in the stub 135 when the real part of the plasma impedance decreases. In FIG. 4, the current standing wave amplitude is plotted as a function of axial location along the stub 135. A discontinuity in the standing wave current amplitude at the location 0.1 marks the position of the tap 160. In the graph of FIG. 4, the real part of the plasma impedance is low, below the nominal plasma impedance for which the system is tuned. In this case, the current at the tap 160 adds to the standing wave current in the stub 135. This addition increases the delivered power to offset the decreased load, to avoid a concomitant decrease in delivered power, $I^2R$, due to the decreased load, R. With such compensation, much greater changes in load impedance can be accommodated so that the match space in increased significantly.

This expansion of the match space to accommodate a 60:1 swing in the real part of the load impedance enhances process window and reliability of the reactor. This is because as operating conditions shift during a particular process or application, or as the reactor is operated with different operating recipes for different applications, the plasma impedance will change, particularly the real part of the impedance. In the prior art, such a change could readily exceed the range of the conventional match circuit employed in the system, so that the delivered power could no longer be controlled sufficiently to support a viable process, and the process could fail. In the present invention, the range of the real part of the load impedance over which delivered power can be maintained at a desired level has been increased so much that changes in plasma impedance, which formerly would have led to a process failure, have little or no effect on a reactor embodying this aspect of the invention. Thus, the invention enables the reactor to withstand far greater changes in operating conditions during a particular process or application. Alternatively, it enables the reactor to be used in many different applications involving a wider range of process conditions, a significant advantage.

As a further advantage, the coaxial stub 135 that provides this broadened impedance match is a simple passive device with no "moving parts" such as a variable capacitor/servo or a variable frequency/servo typical of conventional impedance match apparatus. It is thus inexpensive and far more reliable than the impedance match apparatus that it replaces.

De-Tuning the Operating and Resonant Frequencies to Broaden the Process Window:

In accordance with a further aspect of the preferred embodiment, the system Q is reduced to broaden the process window by slightly offsetting the stub resonant frequency, the electrode plasma resonant frequency and the plasma source power frequency from one another. As described above, the stub resonant frequency is that frequency at which the axial length of the stub 135 is a half wavelength, and the electrode-plasma resonant frequency is the frequency at which the electrode assembly 126 and the plasma resonate together. In the preferred embodiment, the stub 135 was cut to a length at which its resonant frequency was 220 MHz, the RF source power generator 150 was selected to operate at 210 MHz and the resulting electrode-plasma resonant frequency was about 200 MHz.

By choosing three such differing frequencies for plasma resonance, stub resonance and source power frequency, rather than the same frequency for all three, the system has been somewhat "de-tuned". It therefore has a lower "Q". The use of the higher VHF source power frequency proportionately decreases the Q as well (in addition to facilitating the match of the electrode and plasma capacitances under etch-favorable operating conditions).

Decreasing system Q broadens the impedance match space of the system, so that its performance is not as susceptible to changes in plasma conditions or deviations from manufacturing tolerances. For example, the electrode-plasma resonance may fluctuate due to fluctuations in plasma conditions. With a smaller Q, the resonance between the stub 135 and the electrode-plasma combination that is necessary for an impedance match (as described previously in this specification) changes less for a given change in the plasma-electrode resonance. As a result, fluctuations in plasma conditions have less effect on the impedance match. Specifically, a given deviation in plasma operating conditions produces a smaller increase in VSWR at the output of RF generator 150. Thus, the reactor may be operated in a wider window of plasma process conditions (pressure, source power level, source power frequency, plasma density, etc). Moreover, manufacturing tolerances may be relaxed to save cost and a more uniform performance among reactors of the same model design is achieved, a significant advantage. A related advantage is that the same reactor may have a sufficiently wide process window to be useful for operating different process recipes and different applications, such as metal etch, dielectric etch and/or chemical vapor deposition.

Minimizing the Stub Characteristic Impedance to Broaden the Process Window:

Another choice that broadens the tuning space or decreases the system Q is to decrease the characteristic impedance of the stub 135. However, the stub characteristic impedance preferably exceeds the generator output impedance, to preserve adequate match space. Therefore, in the preferred embodiment, the system Q is preferably reduced, but only to the extent of reducing the amount by which the characteristic impedance of the stub 135 exceeds the output impedance of the signal generator 150.

The characteristic impedance of the coaxial stub 135 is a function of the radii of the inner and outer conductors 140, 145 and of the dielectric constant of the insulator 147 therebetween. The stub characteristic impedance is chosen to provide the requisite impedance transformation between the output impedance of the plasma power source 150 and the input impedance at the electrode 135. This characteristic impedance lies between a minimum characteristic impedance and a maximum characteristic impedance. Changing the characteristic impedance of the stub 135 changes the waveforms of FIG. 2 and therefore changes the desired location of the tap 160 (i.e., its displacement, A, from the far end of the stub 135). The allowable minimum characteristic impedance of the stub 135 is the one at which the distance A of FIG. 2 is zero so that tap 160 would have to be located on the far end 135a of the coaxial stub 135 opposite the electrode 125 in order to see a 50 Ohm ratio between the standing wave current and voltage. The allowable maximum characteristic impedance of the stub 135 is the one at which the distance A of FIG. 2 is equal to the length of the stub 135 so that the tap 160 would have to be located at the near end 135b of the coaxial stub 135 adjacent the electrode 125 in order to see a 50 Ohm ratio between the standing wave current and voltage.

In an initial preferred embodiment, the coaxial stub characteristic impedance was chosen to be greater (by about 30%) than the output impedance of the RF generator 150, in order to provide an adequate match space. The stub impedance must exceed the RF generator output impedance because the impedance match condition is achieved by selecting the location of the tap point 160 to satisfy $$Z_{gen} = \alpha^2 [Z_{stub}^2 / r_{plasma}]$$

where α is determined by the location of the tap point and varies between zero and one. (α corresponds to the ratio of the inductance of the small portion of the stub 135 between the far end 135b and the tap 160 to the inductance of the entire stub 135.) Since α cannot exceed one, the stub characteristic impedance must exceed the generator output impedance in order to find a solution to the foregoing equation. However, since the Q of the system is directly proportional to the stub characteristic impedance, the amount by which the stub characteristic impedance exceeds the generator output impedance preferably is somewhat minimized to keep the Q as low as practical. In the exemplary embodiment, the stub characteristic impedance exceeds the generator output impedance by only about 15 Ω.

However, in other embodiments, the coaxial stub characteristic impedance may be chosen to be less than the plasma power source (generator) output impedance to achieve greater power efficiency with some reduction in impedance match.

Increased Power Efficiency Provided by the Impedance Transformation of the Stub:

As discussed earlier in this specification, plasma operating conditions (e.g., plasma density) that favor plasma etch processes result in a plasma impedance that has a very small real (resistive) part (e.g., less 0.3 Ohm) and a small imaginary (reactive) part (e.g., 7 Ohms). Capacitive losses predominate in the combination electrode-plasma area of the system, because the electrode capacitance is the predominant impedance to power flow in that part of the reactor. Therefore, power loss in the electrode-plasma combination is proportional to the voltage on the electrode-plasma combination. In contrast, inductive and resistive losses predominate in the stub 135, because the inductance and resistance of the stub 135 are the predominant elements of impedance to power flow in the stub 135. Therefore, power loss in the stub 135 is proportional to current in the stub. The stub characteristic impedance is much greater than the real part of the impedance presented by the electrode-plasma combination. Therefore, in the higher impedance stub 135 the voltage will be higher and the current lower than in the lower impedance plasma in which the current will be higher and the voltage lower. Thus, the impedance transformation between the stub 135 and the plasma-electrode combination produces a higher voltage and lower current in the stub 135 (where resistive and inductive losses dominate and where these are now minimized) and a correspondingly lower voltage and higher current at the plasma/electrode (where capacitive losses dominate and where these are now minimized). In this manner overall power loss in the system is minimized so that power efficiency is greatly improved, a significant advantage. In the preferred embodiment, power efficiency is about 95% or greater.

Thus, the stub 135, configured as described above in accordance with the invention, serves not only to provide an impedance match or transformation between the generator and the electrode-plasma impedances across a very wide range or window of operating conditions, but in addition provides a significant improvement in power efficiency.

Cross-Grounding:

The ion energy at the wafer surface can be controlled independently of the plasma density/overhead electrode power. Such independent control of the ion energy is achieved by applying an HF frequency bias power source to the wafer. This frequency, (typically 13.56 MHz) is significantly lower than the VHF power applied to the overhead electrode that governs plasma density. Bias power is applied to the wafer by a bias power HF signal generator 200 coupled through a conventional impedance match circuit 210 to the wafer support 105. The power level of the bias generator 200 controls the ion energy near the wafer surface, and is generally a fraction of the power level of the plasma source power generator 150.

As referred to above, the coaxial stub 135 includes a shorting conductor 165 at the outer stub end providing a short circuit between the inner and outer coaxial stub conductors 140, 145. The shorting conductor 165 establishes the location of the VHF standing wave current peak and the VHF standing wave voltage null as in FIG. 2. However, the shorting conductor 165 does not short out the VHF applied power, because of the coupling of the stub resonance and the plasma/electrode resonance, both of which are at or near the VHF source power frequency. The conductor 165 does appear as a direct short to ground for other frequencies, however, such as the HF bias power source (from the HF bias generator 200) applied to the wafer. It also shorts out higher frequencies such as harmonics of the VHF source power frequency generated in the plasma sheath.

The combination of the wafer and wafer support 205, the HF impedance match circuit 210 and the HF bias power source 200 connected thereto provides a very low impedance or near short to ground for the VHF power applied to the overhead electrode. As a result, the system is cross-grounded, the HF bias signal being returned to ground through the overhead electrode 125 and the shorted coaxial stub 135, and the VHF power signal on the overhead electrode 135 being returned to ground through a very low impedance path (for VHF) through the wafer, the HF bias impedance match 210 and the HF bias power generator 200.

The exposed portion of the chamber side wall between the plane of the wafer and the plane of the overhead electrode 125 plays little or no role as a direct return path for the VHF power applied to the overhead electrode 125 because of the large area of the electrode 125 and the relatively short electrode-to-wafer gap. In fact, the side wall of the chamber may be isolated from the plasma using magnetic isolation or a dielectric coating or an annular dielectric insert or removable liner.

In order to confine current flow of the VHF plasma source power emanating from the overhead electrode 125 within the vertical electrode-to-pedestal pathway and away from other parts of the chamber 100 such as the sidewall, the effective ground or return electrode area in the plane of the wafer 110 is enlarged beyond the physical area of the wafer or wafer support 105, so that it exceeds the area of the overhead electrode 125. This is achieved by the provision of the annular semiconductor ring 115 generally coplanar with and surrounding the wafer 110. The semiconductor ring 115 provides a stray capacitance to the grounded chamber body and thereby extends the effective radius of the "return" electrode in the plane of the wafer 110 for the VHF power signal from the overhead electrode. The semiconductor ring 115 is insulated from the grounded chamber body by the dielectric ring 120. The thickness and dielectric constant of the ring 120 is selected to achieve a desirable ratio of VHF ground currents through the wafer 110 and through the semiconductor ring 115. In a preferred embodiment, the dielectric ring 120 was quartz, having a dielectric constant of 9 and was of a thickness of 10 mm.

In order to confine current flow from the HF plasma bias power from the bias generator 200 within the vertical path between the surface of the wafer and the electrode 135 and avoid current flow to other parts of the chamber (e.g., the sidewall), the overhead electrode 135 provides an effective HF return electrode area significantly greater than the area of the wafer or wafer support 105. The semiconductor ring 115 in the plane of the wafer support 105 does not play a significant role in coupling the HF bias power into the chamber, so that the effective electrode area for coupling the HF bias power is essentially confined to the area of the wafer and wafer support 105.

Enhancement of Plasma Stability:

In a preferred mode of the invention, plasma stability was enhanced by eliminating D.C. coupling of the plasma to the shorting conductor 165 connected across the inner and outer stub conductors 140, 145 at the back of the stub 135. This is accomplished by the provision of the thin capacitive ring 180 between the coaxial stub inner conductor 140 and the electrode 125. In the embodiment of FIG. 1, the ring 180 is sandwiched between the electrode 125 on the bottom and the conductive annular inner housing support 176. Preferably, in the exemplary embodiments described herein, the capacitive ring 180 had a capacitance of about 180 picoFarads, depending on the frequency of the bias chosen, about 13 MHz. With such a value of capacitance, the capacitive ring 180 does not impede the cross-grounding feature described above. In the cross-grounding feature, the HF bias signal on the wafer pedestal is returned to the RF return terminal of the HF bias generator 150 via the stub 135 while the VHF source power signal from the electrode 125 is returned to the RF return terminal of the VHF source power generator 150 via the wafer pedestal.

Figure 5:
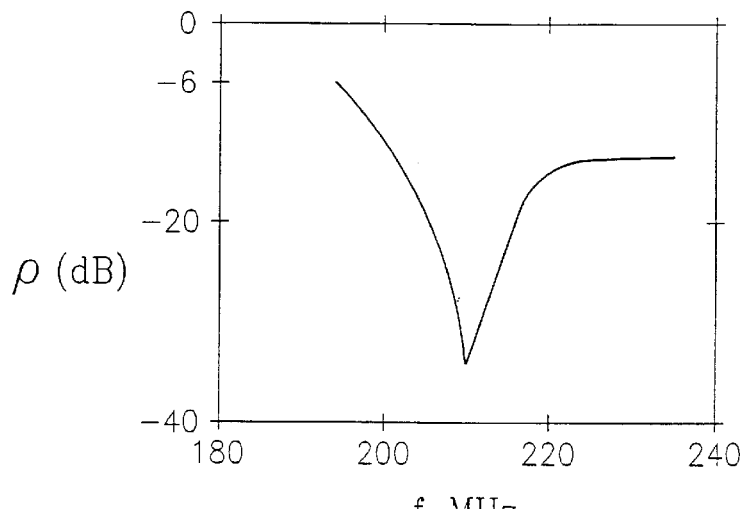
FIG. 5 is a graph illustrating the low-Q reflection coefficient as a function of frequency of the embodiment of FIG. 1.

FIG. 5 is a graph illustrating the reflection coefficient between the VHF power source and the overhead electrode 135 as a function of frequency in a preferred embodiment of the invention. This graph illustrates the existence of a very broad band of frequencies over which the reflection coefficient is below 6 dB, which is indicative of the highly advantageous low system Q discussed above.

Figure 6:
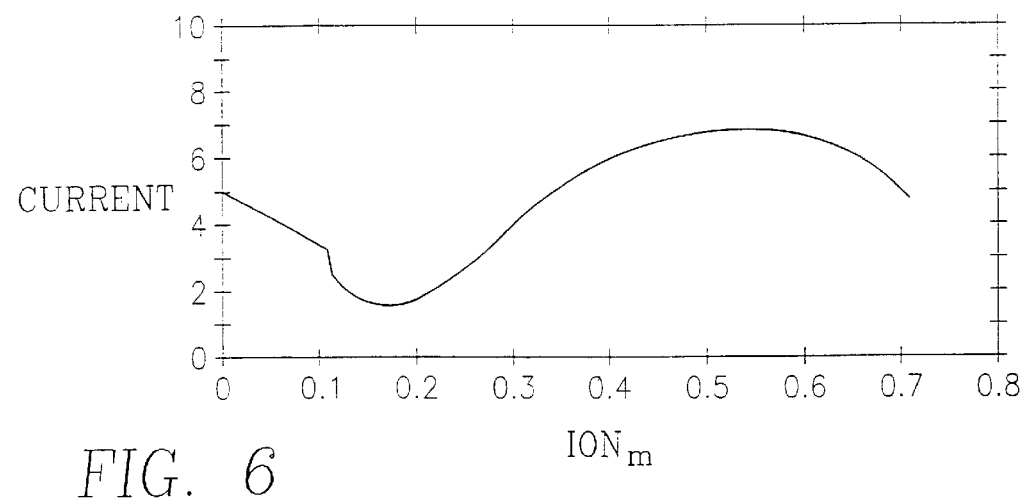
FIG. 6 is a graph illustrating the interaction of the current contribution at the input power tap point on the coaxial stub with the standing wave current and voltage along the stub length.

FIG. 6 illustrates the standing wave current (solid line) and standing wave voltage (dashed line) as a function of position along the coaxial stub 135 in the case in which the tap 160 is placed at the distance A of FIG. 2B from the shorted end of the stub.

Figure 7:
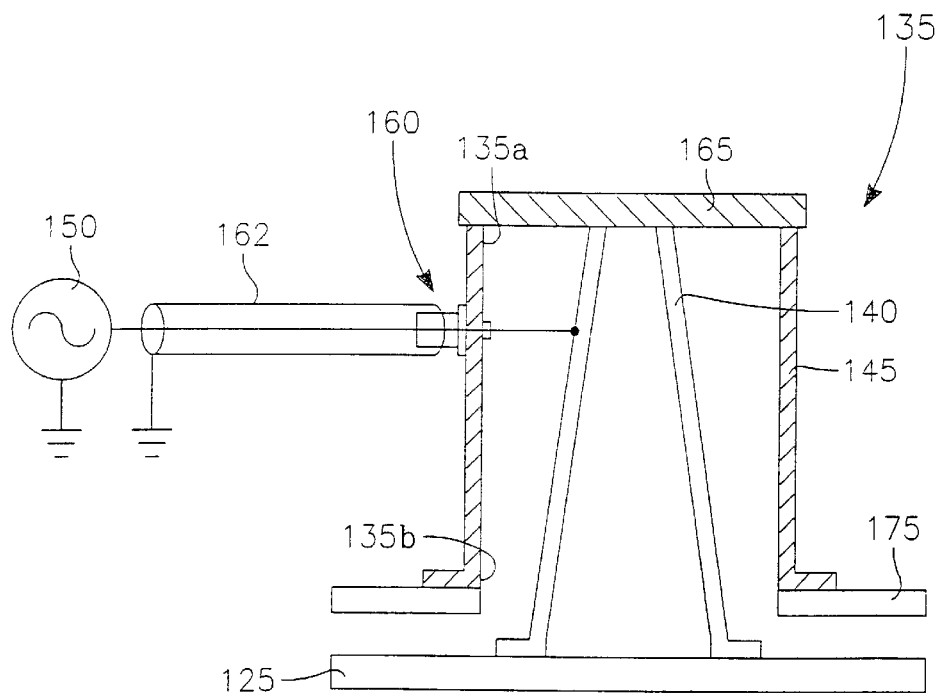
FIG. 7 illustrates an alternative embodiment of the coaxial stub of FIG. 1.
Figure 8:
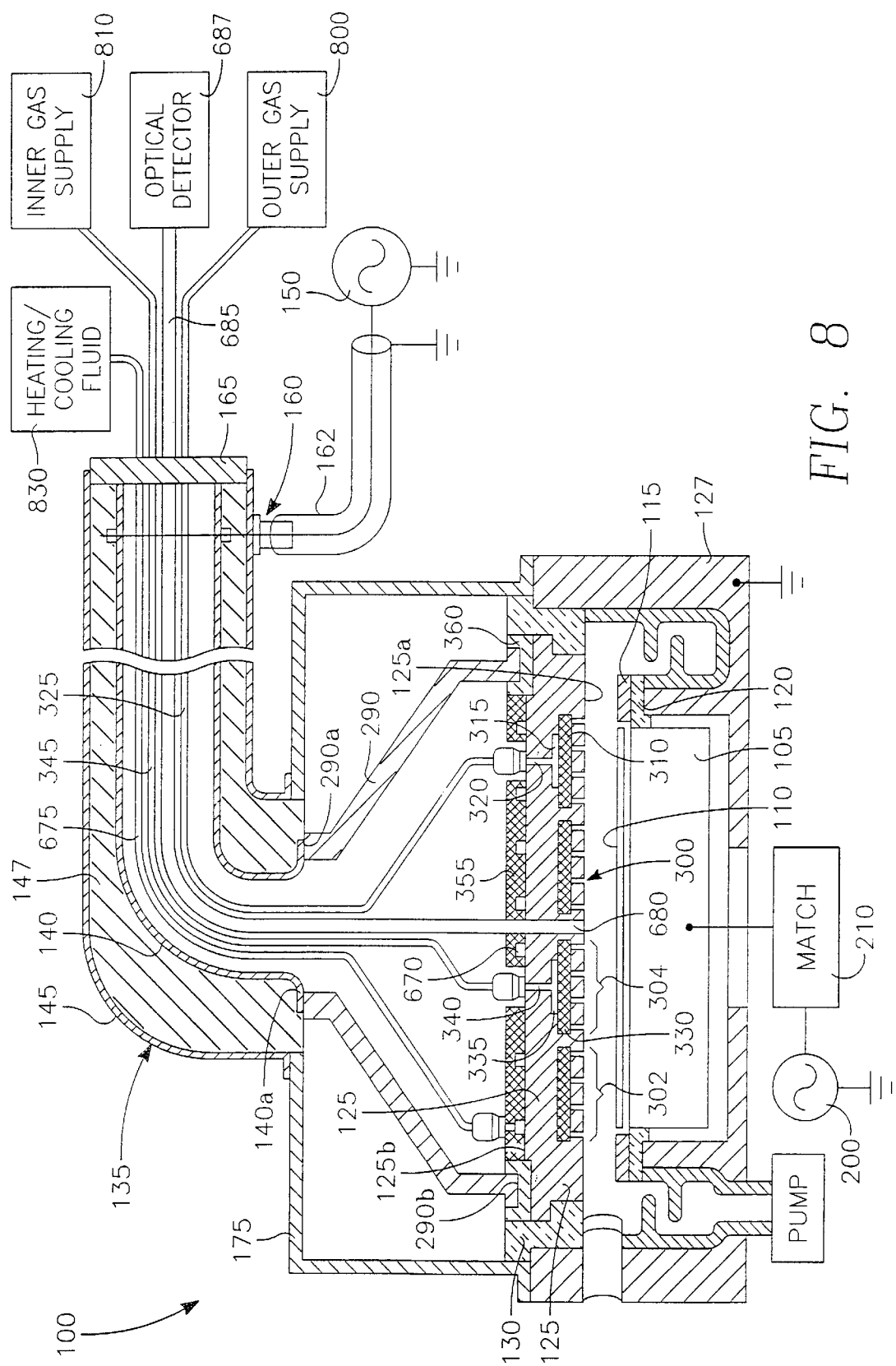
FIG. 8 depicts another embodiment in accordance with the present invention.
Figure 9:
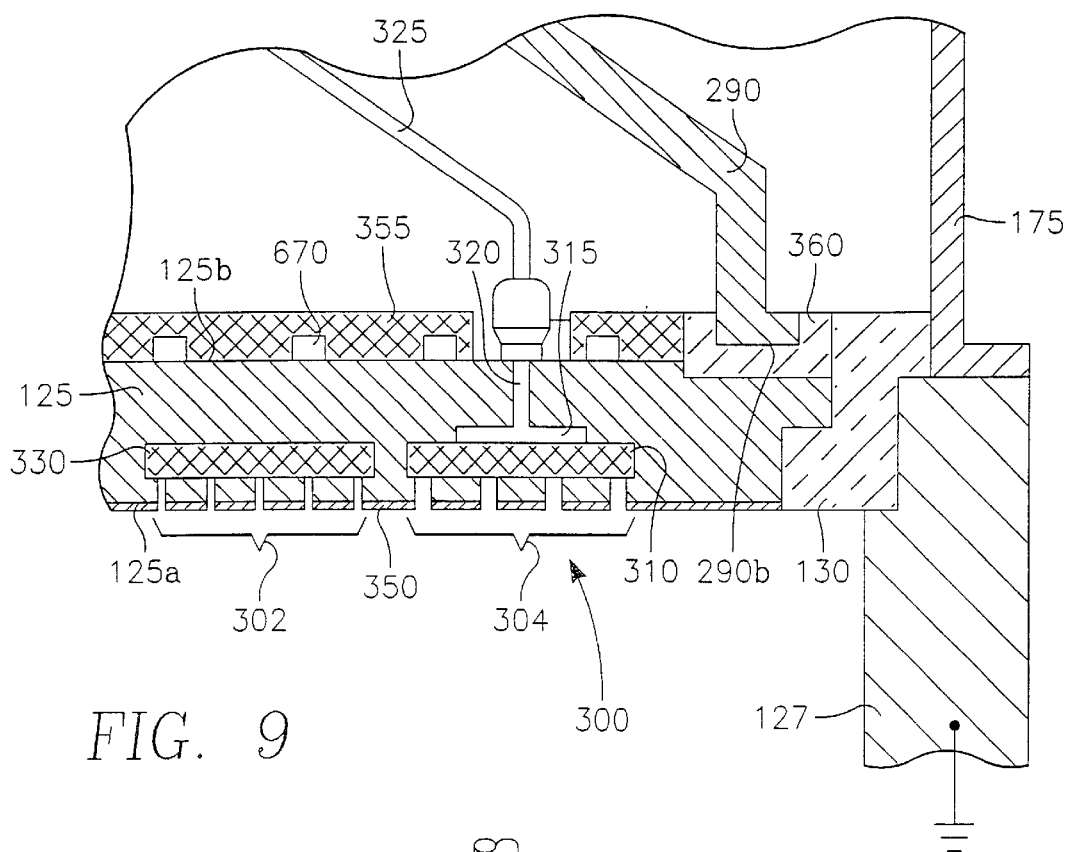
FIG. 9 is an enlarged view corresponding to FIG. 8.
Figure 10:
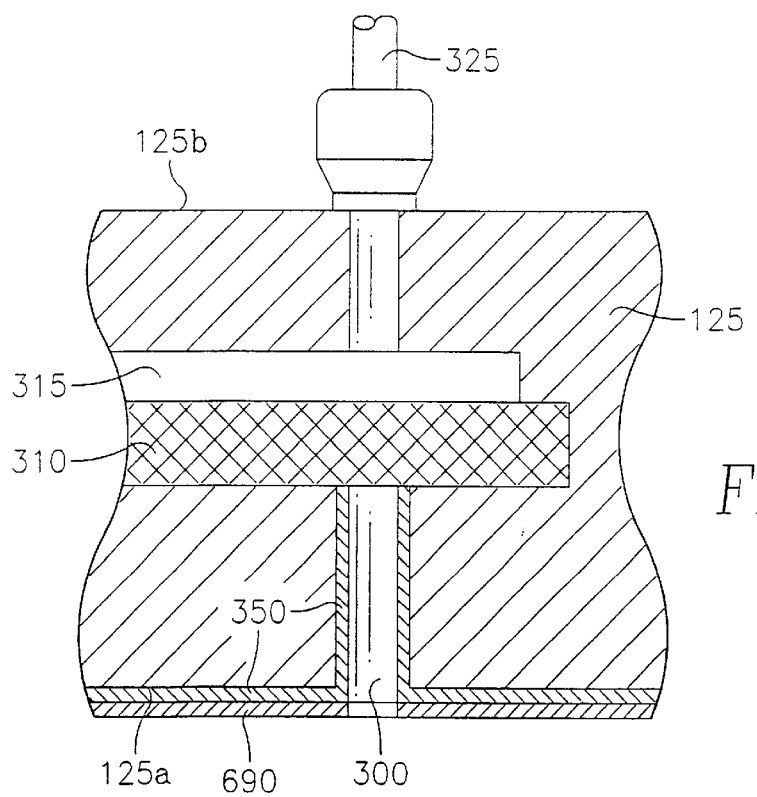
FIG. 10 is an enlarged view of FIG. 9.
Figure 11:
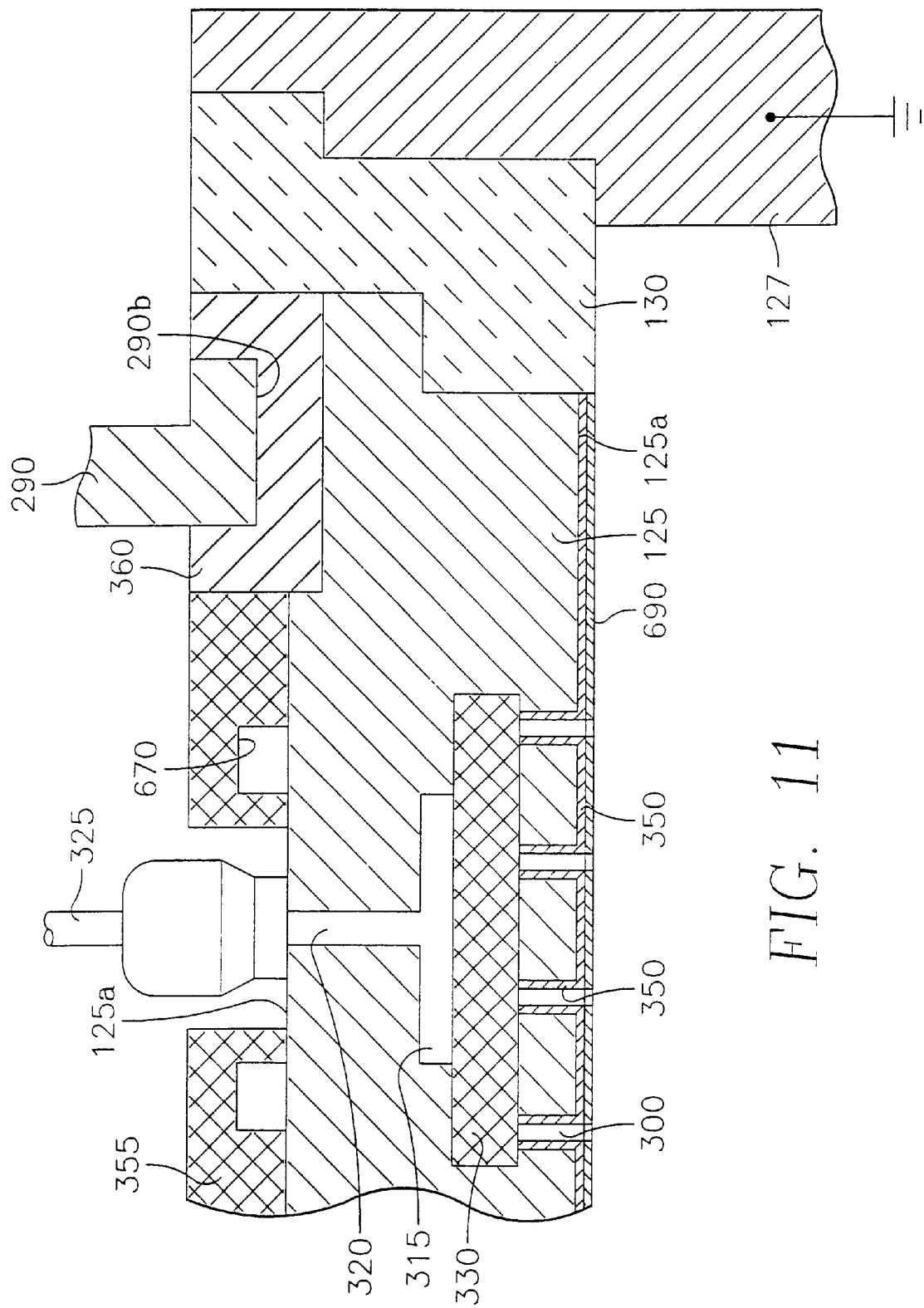
FIG. 11 is another enlarged view of FIG. 8.
Figure 12:
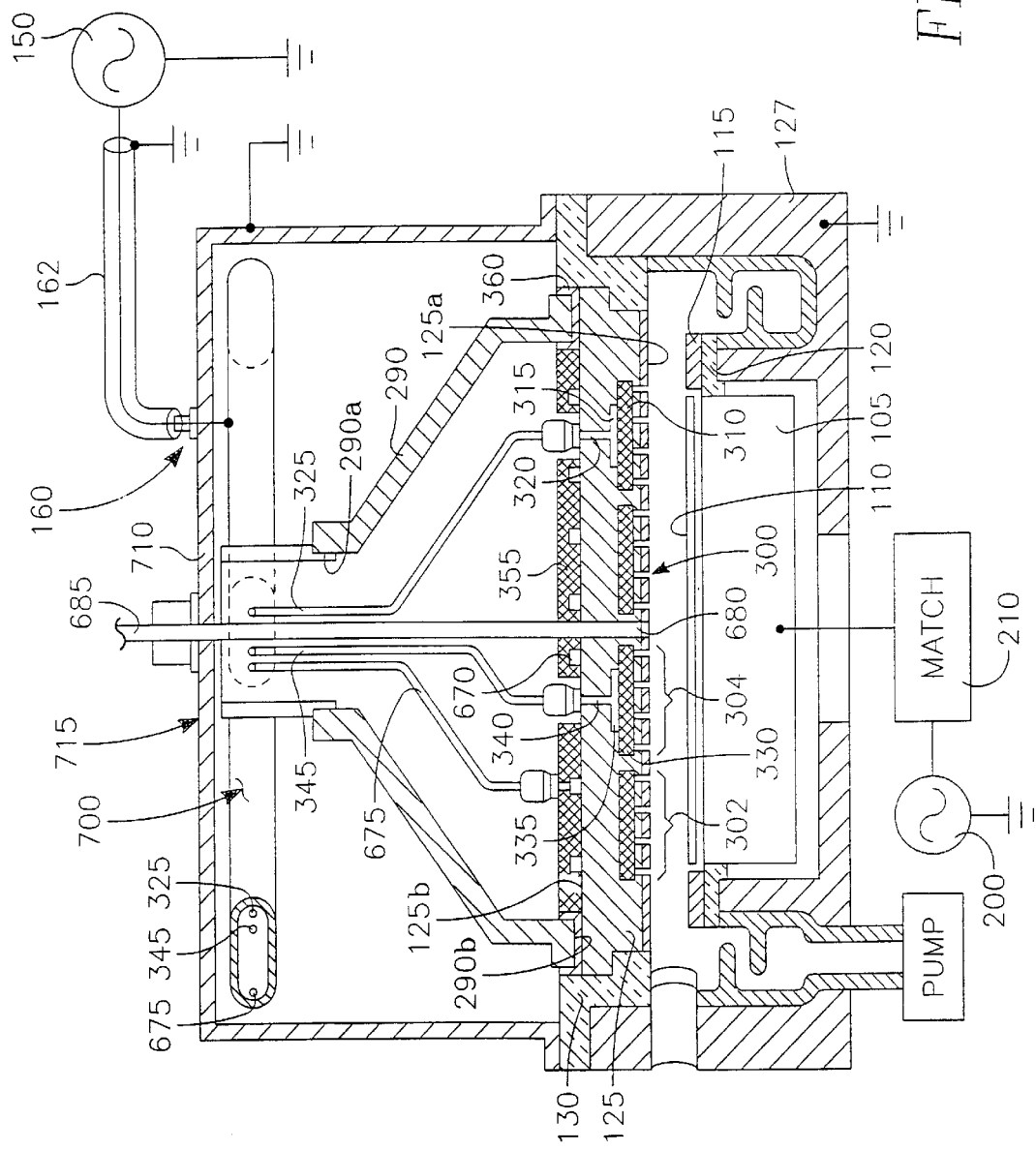
FIG. 12 depicts yet another embodiment in accordance with the invention.
Figure 13:
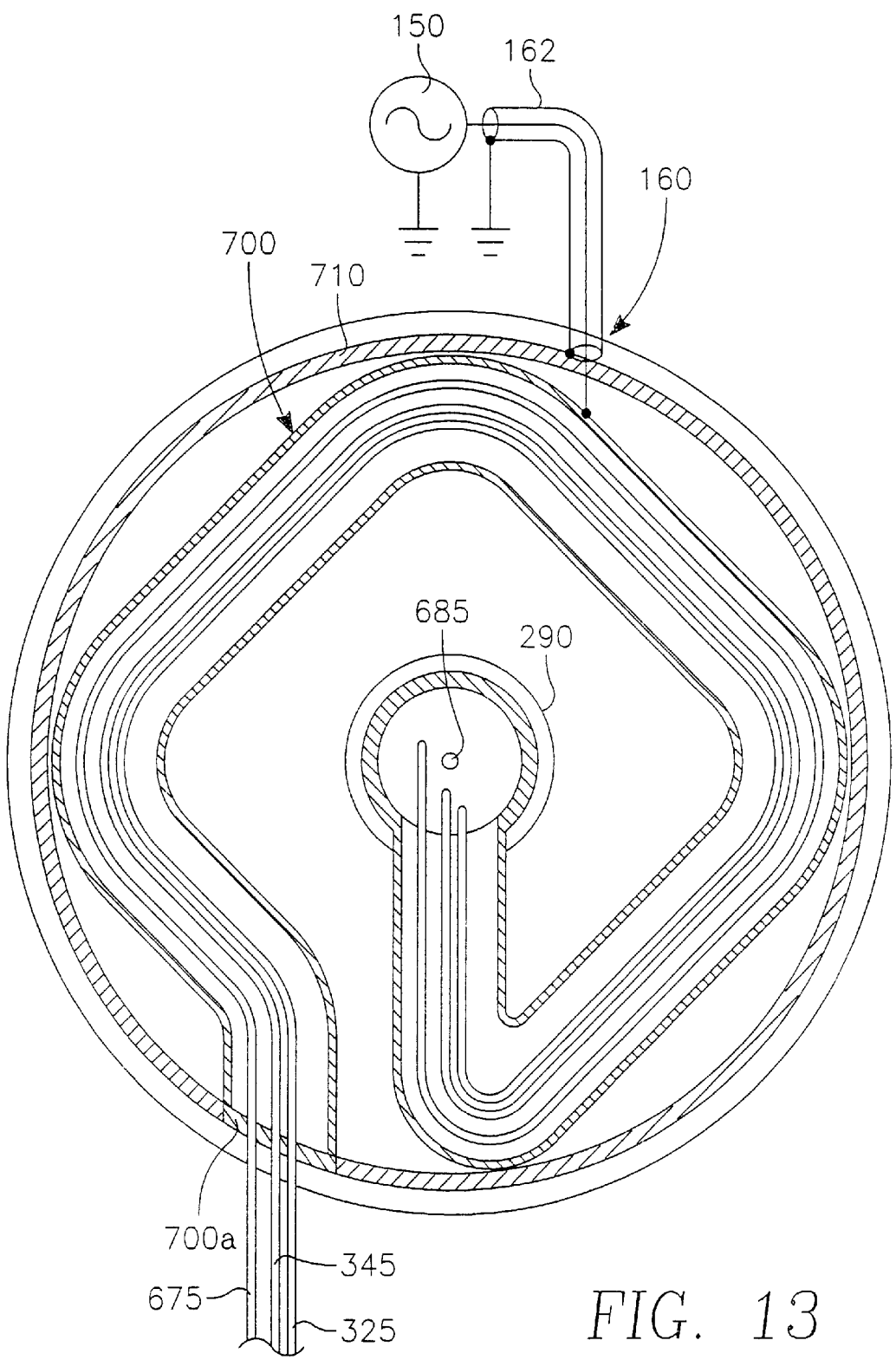
FIG. 13 is a top view corresponding to FIG. 12.
Figure 14:
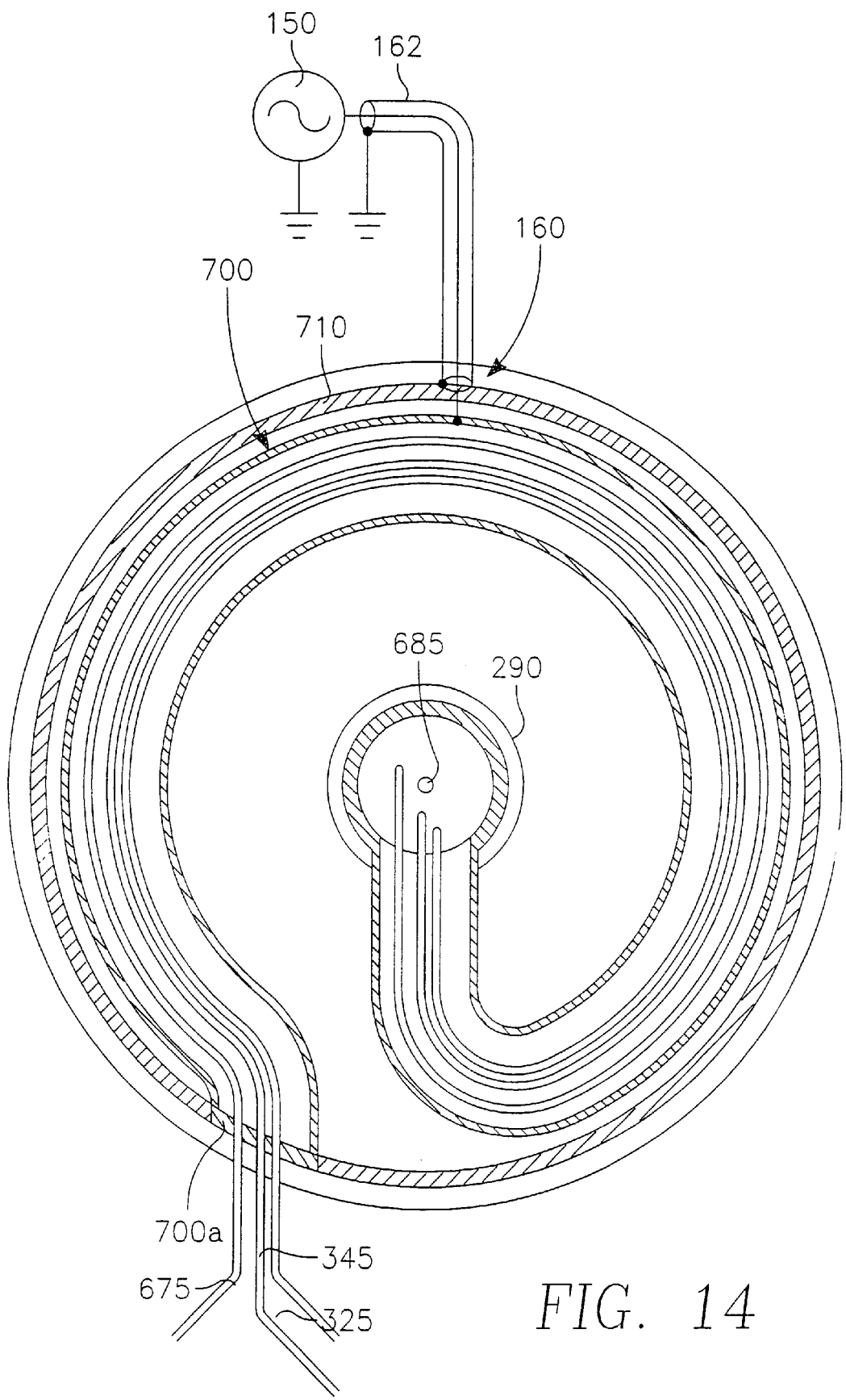
FIG. 14 is a top view corresponding to an alternate embodiment of the reactor of FIG. 13.

FIG. 7 illustrates an alternative embodiment of the invention in which the inner conductor 140 of the coaxial stub 135 is tapered, having a larger radius at the near stub end 135a adjacent the overhead electrode 125 and a smaller radius at the far stub end 135b. This feature provides a transition between a low impedance (e.g., 50 Ω) presented by the coaxial stub 135 at the tap 160 and a higher impedance (e.g., 64 Ω) presented by the coaxial stub 135 at the overhead electrode 125.

Results:

The invention thus provides a plasma reactor which is far less sensitive to changes in operating conditions and/or variations in manufacturing tolerances. It is believed that these great advantages including lack of sensitivity to operating conditions—i.e., broad tuning or frequency space for impedance matching—are the contributions of a number of reactor features working together in combination, including an overhead reactor electrode having a capacitance matching or nearly matching the magnitude of the negative capacitance of the plasma at the most desired processing plasma ion densities, use of a VHF source power frequency matching or nearly matching the plasma-electrode resonance frequency; the close relationship of the VHF source power frequency, the plasma-electrode resonance frequency and the stub resonance frequency; offsetting the plasma-electrode resonance frequency, the stub resonance frequency and the source power frequency from one another; and the use of a resonant stub match to couple source power to the overhead electrode, preferably with the source power input tap 160 offset slightly from the ideal match location.

It is believed that offsetting the plasma, stub and source power frequencies broadens the tuning space of the system by, in effect, de-tuning the system. Using a stub match broadens the tuning space by matching across a broader frequency range. Offsetting the stub tap point 160 from the ideal match point further optimizes the system to broaden the tuning space, because this feature has the effect of adding current when delivered power would otherwise decline and of subtracting current when delivered power would otherwise increase. Using a higher (VHF) source power frequency provides a decrease in system Q or an increase in tuning space proportional to the increase in source power frequency. More importantly, this selection allows the electrode-plasma resonance to be matched to the source power frequency at a plasma density favorable to etch processes.

Because the invention renders the reactor virtually immune to changes in process conditions over a broader process window, it provides the three-fold advantage of a reactor that is (a) workable over a wider range of process condition deviations, (b) useful over a broader range of applications (different process recipes) and (c) whose performance is virtually unaffected over a wider range of manufacturing tolerances, so that reactor-to-reactor characteristics are uniform.

Consequently, superior results have been attained. Specifically, the Q of the system has been minimized to about 5 in some cases to retain a superior degree of uniformity of characteristics and performance among different reactors of the same model, and to enhance process window. High plasma densities on the order of $10^{12}$ ions/cc have been achieved consistently with only 2 kW of source power. The system sustained plasmas over a pressure range of 10 mT to 200 mT with no transitions with source power levels as low as 10 W. The shorted impedance matching coaxial stub resonating near the VHF plasma and source power frequencies shorted out parasitic VHF plasma sheath harmonics while realizing a power efficiency in excess of 95%. The system accomodated plasma resistive load variations of 60:1 and reactive load variations of 1.3 to 0.75 while maintaining the source power SWR at less than 3:1.

It is believed that this increased capability to accommodate load variations, and hence expanded process windows, is due in large part to (a) the matching of the electrode and plasma capacitances under the design operating conditions, accomplished as above described by appropriate choice of dielectric values between the electrode 125 and its conductive support as well as the appropriate choice of VHF source power frequency; and (b) the specially configured coaxial stub with the optimal tap positioning, by which the tap current added to the stub current under low load conditions and subtracted from it under high load conditions. It is believed the very high power efficiency is due in large part to the impedance transformation provided by the coaxial stub, which minimizes reflection losses both at the generator connection as well as at the electrode connection, due to obtaining a match between stub resonant frequency and electrode-plasma resonant frequency, along with optimal tap positioning for realizing a low current and high voltage in the coaxial stub where resistive losses dominate and a high current low voltage at the electrode/plasma where capacitive losses dominate. Yet all these benefits are provided while avoiding or minimizing the need for coventional impedance match apparatus.

While preferred embodiments of the invention adapted for silicon and metal etch have been described in detail, the invention is also advantageous for choices of plasma operating conditions other than those described above, including different ion densities, different plasma source power levels, different chamber pressures. These variations will produce different plasma capacitances, requiring different electrode capacitances and different electrode-plasma resonant frequencies and therefore require different plasma source power frequencies and stub resonant frequencies from those described above. Also, different wafer diameters and different plasma processes such as chemical vapor deposition may well have different operating regimes for source power and chamber pressure. Yet it is believed that under these various applications, the invention will generally enhance the process window and stability as in the preferred embodiment described above.

While the invention has been described in detail by reference to preferred embodiments, it is understood that variations and modifications thereof may be made without departing from the true spirit and scope of the invention.

What is claimed is:

1. A plasma reactor for processing a semiconductor workpiece, comprising:

a reactor chamber having a chamber wall and containing a workpiece support for holding the semiconductor workpiece;

an overhead electrode overlying said workpiece support, said electrode comprising a portion of said chamber wall;

an RF power generator for supplying power at a frequency of said generator to said overhead electrode and capable of maintaining a plasma within said chamber at a desired plasma ion density level;

said overhead electrode having a reactance that forms a resonance with the plasma at an electrode-plasma resonant frequency which is at or near said frequency of said generator.

2. The reactor of claim 1 wherein said plasma has a reactance and the reactance of said electrode corresponds to the reactance of said plasma.

3. The reactor of claim 2 wherein the reactance of said electrode is a conjugate of the reactance of said plasma.

4. The reactor of claim 2 wherein the reactance of said plasma comprises a negative capacitance, and wherein the capacitance of said electrode is the same magnitude as the magnitude of said negative capacitance of said plasma.

5. The reactor of claim 1 wherein the frequency of said RF generator and the electrode-plasma resonant frequency are VHF frequencies.

6. The reactor of claim 5 wherein said plasma reactance is a function of said plasma ion density and said plasma ion density supports a selected plasma process of said reactor.

7. The reactor of claim 6 wherein said plasma process is a plasma etch process and wherein said plasma ion density lies in a range from about $10^9$ ions/cubic centimeter to about $10^{12}$ ions/cubic centimeter.

8. The reactor of claim 1 further comprising a fixed impedance matching element connected between said generator and said overhead electrode, said fixed impedance match element having a match element resonant frequency.

9. The reactor of claim 8 wherein the match element resonant frequency and said electrode-plasma resonant frequency are offset from one another and the frequency of said generator lies between said electrode-plasma resonant frequency and said match element resonant frequency.

10. The reactor of claim 9 wherein said frequency of said generator, said plasma frequency and said match element resonant frequency are all VHF frequencies.

11. The reactor of claim 8 wherein said fixed impedance match element comprises:

a coaxial stub having a near end thereof adjacent said overhead electrode for coupling power from said RF power generator to said overhead electrode and providing an impedance transformation therebetween, said coaxial stub comprising:

an inner conductor connected at said near end to said overhead electrode, an outer conductor around and spaced from said inner conductor and connected at said near end to an RF return potential of said RF power generator, a tap at a selected location along the axial length of said stub, said tap comprising a connection between said inner conductor and an output terminal of said RF power generator.

12. The reactor of claim 11 further comprising a shorting conductor connected at a far end of said stub opposite said near end to said inner and outer connectors, whereby said far end of said stub is an electrical short.

13. The reactor of claim 11 wherein the length of said stub between said near and far ends is equal to a multiple of a quarter wavelength of said match element resonant frequency of the stub.

14. The reactor of claim 13 wherein said multiple is two whereby said length of said stub is a half-wavelength at said match element resonant frequency.

15. The reactor of claim 13 wherein said frequency of said RF power generator, said match element resonant frequency and said electrode-plasma resonant frequency are all VHF frequencies offset from one another.

16. The reactor of claim 11 wherein said stub comprises aluminum.

17. The reactor of claim 11 wherein said selected location is a location along the length of said stub at which a ratio between a standing wave voltage and a standing wave current in said stub is at least nearly equal to an output impedance of said RF power generator.

18. The reactor of claim 17 wherein said selected location of said tap is shifted from an ideal location at which said ratio is equal to said output impedance, the shift being sufficient to realize an addition of current at said tap whenever the load impedance at said overhead electrode decreases below a nominal level and to realize a subtraction of current at said tap whenever the load impedance at said overhead electrode increases above a nominal level.

19. The reactor of claim 18 wherein the shift from said ideal location is about 5% of one wavelength of the VHF frequency of said RF generator.

20. The reactor of claim 18 wherein the shift from said ideal location is such that at least a 6:1 increase in resistive match space is realized.

21. The reactor of claim 11 further comprising an insulating material between said inner and outer conductors of said stub, said insulating material having a dielectric constant, said dielectric constant and the radii of said inner and outer conductors being such that said coaxial stub has a characteristic impedance which is greater than the output impedance of said RF power generator.

22. The reactor of claim 21 wherein said characteristic impedance of said coaxial stub is about 30% greater than the output impedance of said RF power generator.

23. The reactor of claim 21 wherein said coaxial stub has a characteristic impedance which is less than the output impedance of said RF power generator.

24. The reactor of claim 21 further comprising an insulating seal between said overhead electrode and a remaining portion of said chamber wall, the dielectric constant of said insulating seal and the area of said overhead electrode being such that said plasma in said chamber resonates with said overhead electrode at said electrode-plasma resonant frequency.

25. The reactor of claim 21 wherein said inner conductor is a tapered cylinder, having a maximum radius at said near end of said stub and a minimum radius at said far end of said stub.

26. The reactor of claim 21 further comprising an HF frequency bias power generator and an impedance match circuit connected between said HF frequency bias power generator and said wafer support, wherein the frequency of said RF power generator connected to said electrode, said electrode-plasma resonant frequency and said match element resonant frequency are VHF frequencies.

27. The reactor of claim 26 wherein said wafer support provides an RF return path for VHF power coupled into said chamber from said overhead electrode.

28. The reactor of claim 27 further comprising a semiconductive annular ring surrounding the periphery of said wafer, said ring extending an effective return electrode area presented to VHF power coupled into said chamber from said overhead electrode.

29. The reactor of claim 28 further comprising an insulating annulus supporting said ring and insulating said ring from said chamber wall, the dielectric constant of said ring determining apportionment of VHF power return current between said wafer support and said semiconductor ring.

30. The reactor of claim 28 wherein the effective return electrode area for VHF power coupled into said chamber from said overhead electrode exceeds the area of said overhead electrode.

31. The reactor of claim 30 wherein the combination of said overhead electrode with said coaxial stub provides an RF return path for HF power coupled into said chamber from said wafer support, said overhead electrode having an area greater than the area of said wafer support.

32. The reactor of claim 28 further comprising a capacitive element between said overhead electrode and said fixed impedance matching element, the capacitive element having a capacitance sufficient to provide DC isolation between said plasma and said fixed impedance matching element.

33. The reactor of claim 31 wherein said inner conductor of said coaxial stub comprises a hollow conduit, said reactor further comprising:
   gas inlet apparatus in said overhead ceiling for distributing process gas into said chamber;
   a gas feed line extending through said conduit to said gas inlet apparatus in said overhead ceiling.

34. The reactor of claim 33 wherein said gas feed line comprises metal.

35. The reactor of claim 33 wherein said inner conductor of said coaxial stub comprises a hollow conduit, said reactor further comprising:
   coolant passages within said overhead ceiling;
   a coolant feed line extending through said conduit to said coolant passages in said overhead ceiling.

36. The reactor of claim 35 wherein said coolant feed line comprises metal.

37. A plasma reactor for processing a semiconductor workpiece, comprising:
   a reactor chamber having a chamber wall and containing a workpiece support for holding the semiconductor workpiece;
   an overhead electrode overlying said workpiece support, said electrode comprising a portion of said chamber wall;
   an RF power generator for supplying power at a frequency of said generator to said overhead electrode and capable of maintaining a plasma within said chamber at a desired plasma ion density level;
   said overhead electrode having a capacitance such that said overhead electrode and the plasma formed in said chamber at said desired plasma ion density resonate together at an electrode-plasma responant frequency, said frequency of said generator being at least near said electrode-plasma resonant frequency.

38. The plasma reactor of claim 37 further comprising a fixed impedance matching element connected between said generator and said overhead electrode, said fixed impedance matching element having a match element resonant frequency.

39. The plasma reactor of claim 38 wherein said frequency of said generator lies between said electrode-plasma resonant frequency and said match element resonant frequency.

40. The plasma reactor of claim 39 wherein each of said frequencies is a VHF frequency.

41. A plasma reactor for processing a semiconductor workpiece, comprising:
   a reactor chamber having a chamber wall and containing a workpiece support for holding the semiconductor workpiece;
   a planar overhead electrode overlying said workpiece support, said electrode comprising a portion of said chamber wall;
   an RF power generator capable of supplying power to said overhead electrode to maintain a plasma in said chamber at a desired plasma ion density;
   a coaxial stub having a near end thereof adjacent said overhead electrode for coupling power from said RF power generator to said overhead electrode and providing an impedance transformation therebetween, said coaxial stub having an axis of cylindrical symmetry generally non-parallel to a plane of said planar overhead electrode at an interface therebetween, and comprising:
      an inner conductor connected at said near end to said overhead electrode,
      an outer conductor around and spaced from said inner conductor and coupled at said near end to an RF return potential of said RF power generator through a sidewall portion of said chamber wall,
      a tap at a selected location along the axial length of said stub, said tap comprising a connection between said inner conductor and an output terminal of said RF power generator.

42. The reactor of claim 41 further comprising a shorting conductor connected at a far end of said stub opposite said near end to said inner and outer connectors, whereby said far end of said stub is an electrical short.

43. The reactor of claim 42 wherein said stub has a stub resonant frequency, and the length of said stub between said near and far ends is equal to a multiple of a quarter wavelength of stub resonant frequency.

44. The reactor of claim 43 where said multiple is two whereby said length of said stub is a half-wavelength at said stub respondent frequency.

45. The reactor of claim 43 wherein said RF power generator produces a VHF power signal at a VHF frequency, said stub resonant frequency being a VHF frequency offset from the VHF frequency of said generator.

46. The reactor of claim 45 wherein said overhead electrode has a capacitance such that said electrode and said plasma at said selected plasma ion density resonate together at a VHF electrode-plasma resonant frequency, said VHF frequency of said generator lying between said electrode-plasma resonant frequency and said stub resonant frequency.

47. The reactor of claim 41 wherein said selected location is a location at which a ratio between standing voltage and current waves in said stub is at least nearly equal to an output impedance of said RF power generator.

48. The reactor of claim 47 wherein said selected location of said tap is shifted from an ideal location at which said ratio is equal to said output impedance, the shift being sufficient to realize an addition of current at said tap whenever the load impedance at said overhead electrode decreases below a nominal level and to realize a subtraction of current at said tap whenever the load impedance at said overhead electrode increases above a nominal level.

49. The reactor of claim 48 wherein the shift from said ideal location is about 5% of one wavelength of the stub resonant frequency.

50. The reactor of claim 48 wherein the shift from said ideal location is such that at least a 6:1 increase in resistive match space is realized.

51. The reactor of claim 41 further comprising an insulating material between said inner and outer conductors of said stub, said insulating material having a dielectric constant, said dielectric constant and the radii of said inner and outer conductors being such that said coaxial stub has a characteristic impedance which is greater than the output impedance of said RF power generator.

52. The reactor of claim 51 wherein said characteristic impedance of said coaxial stub is about 30% greater than the output impedance of said RF power generator.

53. The reactor of claim 41 wherein said coaxial stub has a characteristic impedance which is less than the output impedance of said RF power generator.

54. The reactor of claim 41 further comprising an insulating seal between said overhead electrode and a remaining portion of said chamber wall, the dielectric constant of said insulating seal and the area of said overhead electrode being such that the plasma at said selected plasma ion density and said overhead electrode resonate together at a VHF electrode-plasma resonant frequency.

55. The reactor of claim 51 wherein said inner conductor is a tapered cylinder, having a maximum radius at said near end of said stub and a minimum radius at said far end of said stub.

56. The reactor of claim 41 further comprising an HF frequency bias power generator and an impedance match circuit connected between said HF frequency bias power generator and said wafer support.

57. The reactor of claim 56 wherein said wafer support provides an RF return path for VHF power coupled into said chamber from said overhead electrode.

58. The reactor of claim 57 further comprising a semiconductive annular ring surrounding the periphery of said wafer, said ring extending an effective return electrode area presented to VHF power coupled into said chamber from said overhead electrode.

59. The reactor of claim 58 further comprising an insulating annulus supporting said ring and insulating said ring from said chamber wall, the dielectric constant of said ring determining apportionment of VHF power return current between said wafer support and said semiconductor ring.

60. The reactor of claim 58 wherein the effective return electrode area for VHF power coupled into said chamber from said overhead electrode exceeds the area of said overhead electrode.

61. The reactor of claim 60 wherein said overhead electrode with said coaxial stub provides an RF return path for HF power coupled into said chamber from said wafer support, said overhead electrode having an area greater than the area of said wafer support.

62. The reactor of claim 61 wherein said inner conductor of said coaxial stub comprises a hollow conduit, said reactor further comprising:
gas inlet apparatus in said overhead ceiling for distributing process gas into said chamber;
a gas feed line extending through said conduit to said gas inlet apparatus in said overhead ceiling.

63. The reactor of claim 42 wherein said inner conductor of said coaxial stub comprises a hollow conduit, said reactor further comprising:
coolant passages within said overhead ceiling;
a coolant feed line extending through said conduit to said coolant passages in said overhead ceiling.

64. A method of processing a semiconductor wafer in a plasma reactor chamber, comprising:
providing an overhead electrode having an electrode capacitance and a VHF power generator;
coupling said VHF power generator to said overhead electrode through an impedance matching stub having a length which is a multiple of about one quarter of a VHF stub frequency and connected at one end thereof to said overhead electrode and connected at a tap point therealong to said VHF power generator;
applying an amount of power from said VHF power generator to said overhead electrode to maintain a plasma density at which said plasma and electrode together tend to resonate at a VHF frequency at least near the VHF frequency of said VHF power generator.

65. The method of claim 64 wherein said plasma density lies in a range of $10^9$ through $10^{12}$ ions per cubic centimeter.

66. The method of claim 64 wherein the step of applying power matches a negative capacitance of the plasma to the capacitance of the electrode.

67. The method of claim 64 further comprising:
locating said tap at least near an axial location along the length of said stub at which the ratio between the standing wave voltage and standing wave current equals the output impedance of said VHF generator.

68. The method of claim 67 wherein said locating comprises locating said stub at a position slightly offset from said axial location by an amount which realizes a significant increase in the resistive match space of an impedance match provided by said coaxial stub.

69. The method of claim 68 wherein said significant increase is on the order of a 6:1 increase.

70. The method of claim 69 wherein said position is offset by about 5% of the wavelength of said VHF generator.

71. The method of claim 64 wherein the VHF frequency of said VHF generator lies between said plasma VHF frequency and said stub VHF frequency.

72. The method of claim 64 wherein said multiple is 2 whereby said stub is about a half wavelength at said stub frequency.

73. A plasma reactor for processing a semiconductor workpiece, comprising:
a reactor chamber having a chamber wall and containing a workpiece support for holding the semiconductor workpiece;
a planar electrode at least generally facing said workpiece support;
a coaxial stub having a near end thereof adjacent said overhead electrode said coaxial stub having a cylindrical axis of symmetry generally non-parallel to a plane of said planar electrode at an interface therebetween, and comprising:
an inner conductor connected at said near end to said overhead electrode,
an outer conductor around and spaced from said inner conductor;
an RF generator connected across said inner and outer conductors.

74. The reactor of claim 73 wherein said outer conductor and said wafer support are connected to an RF return potential of said RF generator.

75. The reactor of claim 74 further comprising a coaxial cable providing the connection between said coaxial stub and said RF generator, said coaxial cable having a center conductor connected at one end to an RF output terminal of said RF generator and connected at an opposite end to said electrode, said coaxial cable further having an outer conductor connected at one end to an RF return potential of said RF generator and coupled at an opposite end to said portions of said chamber electrically connected to said wafer support.

76. The reactor of claim 75 wherein said cable has a characteristic impedance equal to the output impedance of said RF generator.

77. The reactor of claim 76 wherein the connection between said inner conductors of said coaxial stub and coaxial cable is at a tap point along the length of said coaxial stub at which the ratio of the standing wave voltage and current in said stub is at least approximately equal to said characteristic impedance of said cable.

78. The reactor of claim 77 wherein the connection between said inner conductors of said coaxial stub and coaxial cable is a tap point slightly offset from a location along the length of said coaxial stub at which the ratio of the standing wave voltage and current in said stub at frequency of said RF generator is equal to said characteristic impedance of said cable.

79. The reactor of claim 78 wherein said tap point is offset from said location by about 5% of a wavelength at the frequency of said RF generator.

80. The reactor of claim 73 further comprising a shorting conductor connected between said inner and outer conductors at a far end of said stub away from said electrode.

81. The reactor of claim 80 wherein the length of said stub between said near and far ends is equal to a multiple of a quarter wavelength of a stub resonant frequency at least near the frequency of said RF generator.

82. The reactor of claim 81 where said multiple is two whereby said length of said stub is a half-wavelength at said stub resonant frequency.

83. The reactor of claim 81 wherein said RF power generator produces a VHF power signal at a VHF frequency, said stub resonant frequency being a VHF frequency offset from the VHF frequency of said generator.

84. The reactor of claim 83 wherein said overhead electrode and the plasma formed in said chamber resonate together at a VHF electrode-plasma resonant frequency, said VHF frequency of said generator lying between said electrode-plasma resonant frequency and said stub resonant frequency.

85. The reactor of claim 73 further comprising an insulating material between said inner and outer conductors of said stub, said insulating material having a dielectric constant, said dielectric constant and the radii of said inner and outer conductors being such that said coaxial stub has a characteristic impedance which is greater than the output impedance of said RF power generator.

86. The reactor of claim 73 wherein said coaxial stub has a characteristic impedance which is less than the output impedance of said RF power generator.

87. The reactor of claim 73 wherein said inner conductor of said coaxial stub comprises a hollow conduit, said reactor further comprising:

gas inlet apparatus in said overhead ceiling for distributing process gas into said chamber;

a gas feed line extending through said conduit to said gas inlet apparatus in said overhead ceiling.

88. The reactor of claim 73 wherein said inner conductor of said coaxial stub comprises a hollow conduit, said reactor further comprising:

coolant passages within said overhead ceiling;

a coolant feed line extending through said conduit to said coolant passages in said overhead ceiling.

89. A method of providing an impedance transformation between the output impedance of an RF generator output and a load impedance at an electrode of a plasma reactor for processing a semiconductor wafer, comprising:

providing a fixed coaxial stub and connecting said fixed coaxial stub between said RF generator output and said electrode; and operating said RF generator at a power level that maintains a plasma in said reactor with a plasma ion density at which the combination of said plasma and said electrode tend to resonate near the output frequency of said RF generator.

90. The method of claim 89 wherein providing a fixed coaxial stub comprises providing a fixed coaxial stub having a characteristic impedance different from said output impedance of said RF generator.

91. The method of claim 1 wherein said density is in the range of $10^9$ to $10^{12}$ ions per cubic centimeter and the frequency of said RF generator is a VHF frequency.

92. The method of claim 89 wherein connecting said fixed stub comprises connecting said RF generator output to said stub at a tap point at least near a location along the length of said stub between the ends thereof at which the ratio standing wave voltage and current is equal to the output impedance of said RF generator.

93. The method of claim 92 wherein said tap point is shifted from said location by a fraction of a wavelength at the frequency of said RF generator.

94. The method of claim 93 wherein said fraction is on the order of 5%.

* * * * *